(12) United States Patent
Risbo et al.

(10) Patent No.: US 7,894,536 B2
(45) Date of Patent: Feb. 22, 2011

(54) CALIBRATION MODEL TO MITIGATE DATA CONVERSION ERRORS

(75) Inventors: Lars Risbo, Copenhagen Ø (DK); Thomas H. Hansen, Værløse (DK)

(73) Assignee: Texas Instruments Incorporated, Dallas, TX (US)

( * ) Notice: Subject to any disclaimer, the term of this patent is extended or adjusted under 35 U.S.C. 154(b) by 1941 days.

(21) Appl. No.: 10/724,817

(22) Filed: Nov. 24, 2003

(65) Prior Publication Data

US 2004/0208249 A1 Oct. 21, 2004

Related U.S. Application Data

(60) Provisional application No. 60/462,912, filed on Apr. 15, 2003.

(51) Int. Cl.
*H04B 14/04* (2006.01)
(52) U.S. Cl. ............ 375/243; 375/244; 375/245; 375/346; 375/350
(58) Field of Classification Search ........ 375/243, 375/245, 254, 240, 240.27, 232, 242; 341/143, 341/118, 120, 131; 455/462
See application file for complete search history.

(56) References Cited

U.S. PATENT DOCUMENTS

| | | | | |
|---|---|---|---|---|
| 4,296,412 A | * | 10/1981 | Mastner | 340/870.19 |
| 4,513,426 A | * | 4/1985 | Jayant | 375/243 |
| 5,028,924 A | * | 7/1991 | Thompson | 341/118 |
| 5,061,925 A | * | 10/1991 | Sooch et al. | 341/120 |
| 5,101,205 A | * | 3/1992 | Yasuda | 341/155 |
| 5,153,593 A | * | 10/1992 | Walden et al. | 341/143 |
| 5,583,501 A | * | 12/1996 | Henrion et al. | 341/118 |
| 5,802,108 A | * | 9/1998 | Kao | 375/245 |
| 6,271,781 B1 | * | 8/2001 | Pellon | 341/143 |
| 6,404,369 B1 | * | 6/2002 | Sheen | 341/143 |
| 6,418,164 B1 | * | 7/2002 | Endres et al. | 375/232 |
| 6,501,405 B1 | | 12/2002 | Zhang et al. | |
| 6,611,795 B2 | * | 8/2003 | Cooper | 702/191 |
| 7,245,246 B2 | * | 7/2007 | Ihs et al. | 341/143 |
| 2004/0160348 A1 | * | 8/2004 | Hochschild | 341/143 |
| 2004/0190649 A1 | * | 9/2004 | Endres et al. | 375/326 |

OTHER PUBLICATIONS

M. Erbar, M. Rieger, and H. Schemmann, "A 1.28-GHz sigma-delta modulator for video A/D conversion," in Proc. IEEE Int. Conf. Consumer Electron., 1996, pp. 78-79.*

R. Schreier, M. V. Goodson, and B. Zhang, "An algorithm for computing convex positively invariant sets for delta-sigma modulators," IEEE Trans. Circuits System. I, vol. 44, pp. 38-44, Jan. 1997.*

(Continued)

*Primary Examiner*—Chieh M Fan
*Assistant Examiner*—Qutbuddin Ghulamali
(74) *Attorney, Agent, or Firm*—John J. Patti; Wade A. Brady, III; Fredrick J. Telecky, Jr.

(57) ABSTRACT

An error model can be utilized to mitigate errors associated with a conversion system, such as an analog-to-digital or digital-to analog converter. The error model is adaptively calibrated to approximate error characteristics associated with at least a portion of the conversion system, such as a digital-to analog converter. The error model can be generated on-line during system operation or off-line to improve performance of various types of signal converters and systems using such signal converters.

14 Claims, 11 Drawing Sheets

OTHER PUBLICATIONS

Zourntos, et al, "Variable-Structure Compensation of Delta-Sigma Modulators: Stability and Performance", IEEE Transactions on Circuits and Systems-I: Fundamental Theory . . . and Applications, vol. 49, No. 1, Jan. 2002, p. 41-53.

* cited by examiner

CALIBRATION MODEL TO MITIGATE DATA CONVERSION ERRORS

RELATED APPLICATION

This application claims the benefit of U.S. Provisional Patent Application No. 60/462,912, which was filed Apr. 15, 2003 and entitled CALIBRATED MODEL TO MITIGATE DATA CONVERSION ERRORS, which is hereby incorporated by reference.

TECHNICAL FIELD

The present invention relates generally to signal processing and, more particularly, to a model calibrated to mitigate errors in data conversion.

BACKGROUND OF THE INVENTION

Various technologies (e.g., communications, signal processing etc.) employ conversion systems to convert an input signal from one form to another, such as from analog-to-digital or from digital-to-analog. Many of these conversion systems have benefited from the use of modulation techniques, such as delta-sigma modulation, to achieve a high degree of accuracy in the conversion. Delta sigma modulation can be implemented in the analog or digital domain, employing noise shaping and, depending on the implementation, quantization.

Non-linearities or other errors can result when delta-sigma modulation is utilized in conjunction with analog-to-digital, digital-to-analog or digital-to-digital conversion. Many of such errors are attributable to process variations or other limitations in the analog circuits associated with the converters being used. One area of particular interest that employs conversions systems is telecommunications. In order to provide adequate levels of service, such as to accommodate increasing Internet-based demands, a variety of digital access solutions are being developed and improved. For example, Digital Subscriber Line (DSL) technology and variants thereof provide transport mechanisms for delivering high-bandwidth digital data. The increasing demands on the telecommunications industry to provide adequate bandwidth to accommodate user demands has prompted significant research and development into improving communications services, including both wired and wireless services.

In order to improve conversion systems for communications and other technologies, various techniques have been developed to compensate for the non-linearities and errors that tend to occur with the signal conversion process. For example, component mismatches can be corrected by traditional randomization techniques on the component to average out and minimize mismatch effects, or by the trimming of analog components. These approaches are generally expensive. Self-calibration techniques have also been developed, although such approaches tend to be intractable or otherwise too complicated and/or expensive for efficient implementation.

SUMMARY OF THE INVENTION

The following presents a simplified summary of the invention in order to provide a basic understanding of some aspects of the invention. This summary is not an extensive overview of the invention. It is intended to neither identify key or critical elements of the invention nor delineate the scope of the invention. Its sole purpose is to present some concepts of the invention in a simplified form as a prelude to the more detailed description that is presented later.

The present invention relates generally to a model adaptively configured to mitigate errors associated with data conversion. The model is applicable for use in connection with analog-to-digital and digital-to-analog conversion.

According to one aspect of the present invention, the model is programmed to provide an emulated error signal as a function of an input signal, which is quantized in a predetermined number of levels. The emulated error signal defines a model having parameters adaptively calibrated to emulate error characteristics associated with at least a portion of the conversion system. The parameters can be calibrated based on an output signal of the conversion system, such as based on inband frequency content of the output signal.

Another aspect of the present invention provides a conversion system that employs a model to mitigate errors associated with at least a portion of the conversion system. The conversion system can be an analog-to-digital converter or a digital-to-analog converter. The conversion system employs noise shaping to process an input signal to facilitate conversion to a desired type of signal (e.g., digital or analog). A compensation system is operative to introduce an emulated error signal as a function of an intermediate conversion signal having a predetermined number of quantization levels. The emulated error signal operates to mitigate errors associated with the conversion.

Yet another aspect of the present invention provides a system and/or method to program a model that is operative to mitigate errors associated with at least a portion of a conversion system, such as errors associated with a digital-to-analog converter. The model is adaptively programmed during a calibration mode of the system to define parameters capable of emulating the errors for predetermined quantization levels of a digital signal of the conversion system based on residual error at the output of the conversion system.

BRIEF DESCRIPTION OF THE DRAWINGS

The foregoing and other aspects of the present invention will become apparent to those skilled in the art to which the present invention relates upon reading the following description with reference to the accompanying drawings.

DETAILED DESCRIPTION

The present invention relates generally to an error model that can be utilized to mitigate errors associated with a conversion system. The error model is adaptively calibrated to approximate error characteristics associated with at least a portion of the conversion system. The error model can be generated on-line during system operation or off-line to improve performance of various types of signal converters and systems using such signal converters. This approach affords improved precision in approximating the error characteristics and enables a cost effective implementation.

Figure 1:
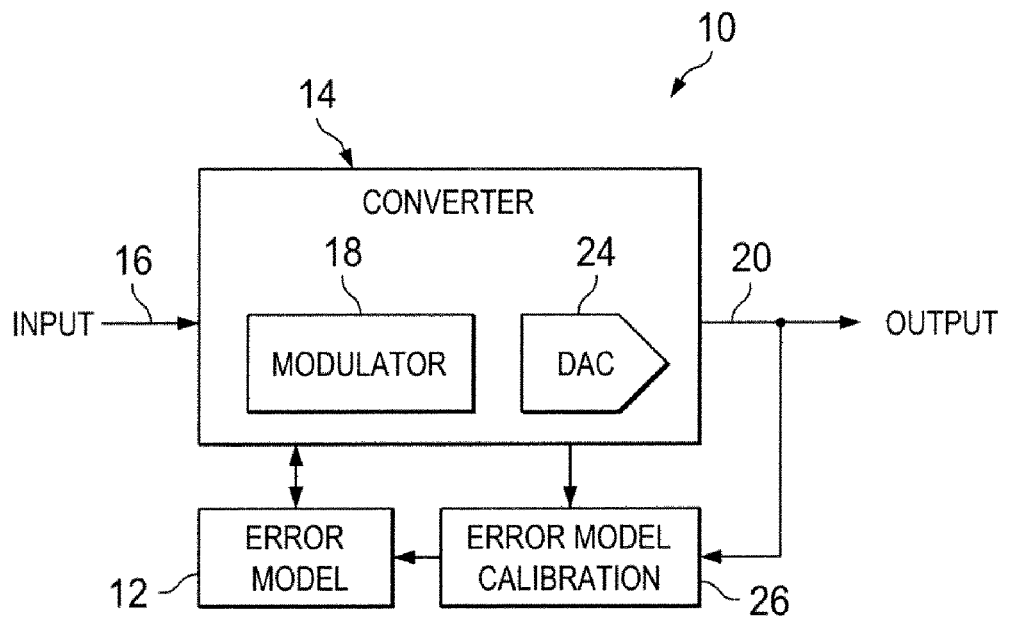
FIG. 1 is a schematic block diagram of a conversion system in accordance with an aspect of the present invention.

FIG. 1 is an example of a generic conversion system 10 that employs an error model 12 to mitigate errors and thereby improve performance of the conversion system in accordance with an aspect of the present invention. The conversion system 10 includes a converter 14. The converter 14 receives an input signal 16, which can be an analog or a digital signal depending on the type of converter 14. The converter 14 can be a digital-to-analog converter (DAC), an analog-to-digital converter (ADC) or a digital-to-digital converter that converts the input signal 16 to a corresponding output signal 20.

The converter 14 includes a modulator 18 that is programmed and/or configured to process the input signal 16. The modulator 18 includes amplitude quantization and is operative to perform noise shaping. The converter 14 provides an output signal 20 having reduced error content based on a corresponding error signal provided to the converter by the model 12.

The converter 14 also includes a DAC 24, which can be a single-bit or multi-bit DAC. The function of the DAC 24 generally depends on the type of converter system 14. For example, where the converter is implemented as a DAC system, the DAC 24 can be operative to convert a noise-shaped and quantized digital representation of the input signal 16 to a corresponding analog output signal 20. Alternatively, where the converter is implemented as an ADC, the DAC 24 can be part of a feedback loop to facilitate analog noise shaping by the modulator 18.

In accordance with an aspect of the present invention, the error model 12 is a digital model with one or more parameters that have been adaptively programmed and/or configured to emulate error characteristics associated with at least a portion of the converter 14. For example, the error model 12 emulates the error characteristics associated with the DAC 24, such as by programming the model parameters based on inband frequency content of a signal (e.g., the output signal 20 or other signal of the converter 14). The error model 12 thus injects or feeds an emulated error signal to the converter 14 as a function of an input signal provided to the DAC 24. The bi-directional signal extending between the converter 14 and the error model 12 thus represents both the emulated error signal provided by the error model and the input signal to the error model for determining the emulated error signal. As a result of the error model 12 injecting the emulated error signal to the converter 14, DAC error in the output signal 20 is effectively mitigated.

The error model 12 can be stored in suitable memory (e.g., static or dynamic random access memory (RAM)), such as a table or other suitable data structure. Those skilled in the art will understand and appreciate various suitable mechanisms (e.g., hardware and/or software) that can be employed to implement the error model 12 in accordance with an aspect of the present invention.

In order to calibrate and generate the error model 12, the system 10 can include an error model calibration system 26. The error model calibration system 26 is programmed and/or configured to adaptively calibrate the error model 12 in accordance with the aspect of the present invention. The adaptive calibration enables a more precise model to be achieved in a more cost efficient manner than many conventional self-calibrating converter systems.

By way of example, the calibration system 26 generates the error model 12 to approximate errors in the converter 14, namely, error characteristics associated with the DAC 24. The error model calibration system 26, for example, sets parameter values (e.g., error coefficients) to characterize non-linearities and/or other errors associated with the DAC 24. These errors may depend on component tolerances and process variations. Thus, in order to characterize the converter errors, a calibration signal may be provided as the input signal 16 during a calibration mode. The calibration signal can be any signal that is operative to excite a considerable part of the amplitude range of the DAC 24.

In accordance with a particular aspect of the present invention, the calibration signal applied at the input 16 is substantially without energy in a specific frequency band, such as a signal not having in-band frequencies. The modulator 18 processes the calibration signal, including noise shaping and, in some cases, other processing to provide a digital signal that is provided to the input of the DAC 24. The error model calibration system 26 can be coupled to obtain the DAC input signal (schematically indicated at 28) and the output signal 20 from the converter 14. The in-band part of the output signal 20 from the converter represents a residual error signal. Because the calibration signal can be provided as containing substantially only out-of-band frequencies, after suitable filtering in the converter 14, the residual error signal in the output signal 20 contains substantially no quantization error and substantially no frequency components from the calibration signal.

As a result, the residual error provided to the calibration system 26 is a low power signal when the system is calibrated, and thus an ADC having a low dynamic range (e.g., an inexpensive ADC) can be utilized to convert the residual error signal to a corresponding digital signal for processing by the error model calibration system 26.

The calibration system 26 can employ the digital representation of the residual error (e.g., corresponding to inband frequency content of the output signal 20) to adjust parameters in the error model 12 in an effort to minimize or otherwise reduce the residual error signal. Those skilled in the art will understand and appreciate various algorithms that can be employed for parameterization of the error model 12. For example, a least mean square (LMS) algorithm or other adaptive algorithm (e.g., recursive least squares, Kalman filter) can be utilized. Thus, during a calibration mode in the conversion system 10, the error model calibration system 26 can iteratively adjust the error model parameters until the in-band part of the output signal 20 (e.g., corresponding generally to residual error) from the converter 14 is adequately minimized. For example, the adaptive algorithm can provide coarser adjustments to the model parameters during an early part of the calibration mode and finer adjustments during a latter part of the calibration mode, which corresponds to the parameters converging toward their final values. The adaptation of parameters can be implemented, for example, as a function of measuring the residual error signal and/or the convergence of the model parameters. Alternatively or additionally, the calibration system 26 can operate for a predetermined period of time or number of samples to learn parameters for the error model 12. It will be appreciated that as the residual error signal approaches zero, the parameters in the error model 12 converge to approximate the actual error.

Those skilled in the art will understand and appreciate that this approach can be utilized with a single-bit or multi-bit DAC implemented as the DAC 24. For example, one or more parameters or coefficients can be determined for each DAC quantization level.

Figure 2:
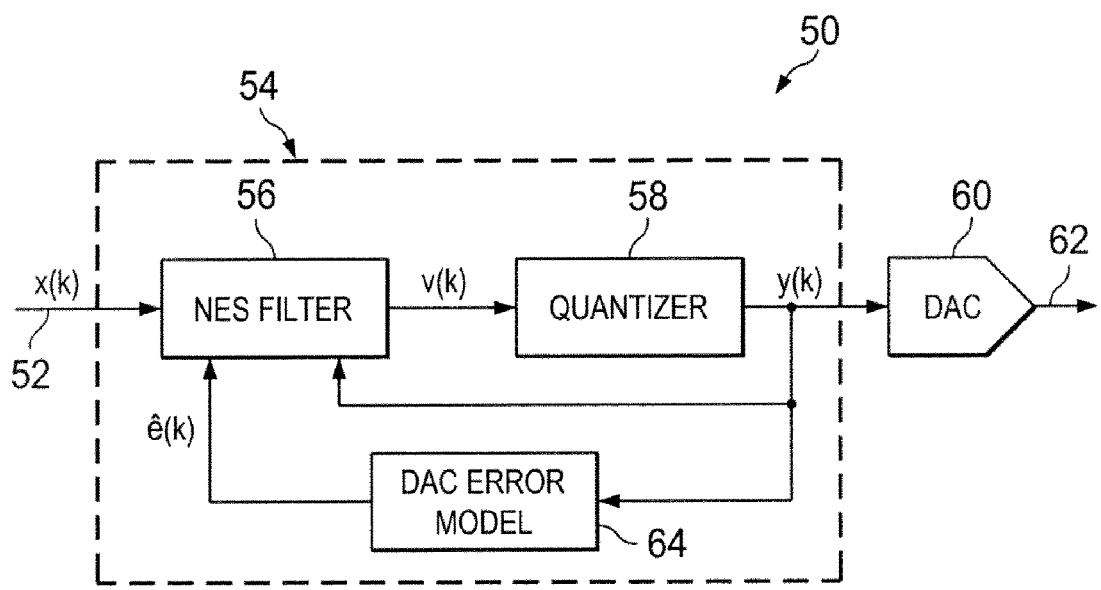
FIG. 2 is an example of a digital-to-analog converter system implemented in accordance with an aspect of the present invention.

FIG. 2 illustrates an example of a digital-to-analog conversion system 50 in accordance with an aspect of the present invention. An input signal x(k) is provided at an input 52 of a noise and error shaping module 54, such as a delta sigma modulator. The input signal x(k) can be a pulse code modulated or other digital input signal. The module 54, for example, can be implemented with hardware and/or software, such as a digital signal processor (DSP), an application specific integrated circuit, or digital combinatorial —or sequential logic.

The module 54 includes a noise and error shaping (NES) filter 56 that receives the input signal x(k) and provides a corresponding filtered output signal v(k) to a quantizer 58. The quantizer 58 quantizes the filtered signal into a corresponding digital output signal y(k) having a predetermined number of amplitude values (or quantization levels). Those skilled in the art will understand and appreciate that quantization to any predetermined number of amplitude values or quantization levels can be utilized in the module 54. The quantizer 58 feeds the output signal y(k) to an associated DAC 60. The DAC 60 can be single-bit or multi-bit DAC that is operative to convert the digital signal y(k) to a corresponding analog output signal 62. The quantized output signal y(k) is also fed to an input of the noise and error shaping filter 56 as well as to a DAC error model 64.

The DAC error model 64 is a digital model that has been calibrated to emulate the error applied by the DAC 60 in accordance with an aspect of the present invention. The DAC error model 64 provides an emulated error signal ê(k) to another input of the NES filter 56. For example, the emulated error signal ê(k) is programmed to approximate errors associated with the DAC 60 as a function of the quantization level in the signal y(k). That is, injecting the emulated error signal ê(k) into the NES filter 56 provides for cross-cancellation of the DAC errors.

The DAC error model 64 can be implemented in hardware and/or software, such as including a look-up table or other data structure programmed to provide an emulated error signal that emulates the DAC errors. The DAC errors, for example, can include non-linearities or other process variations associated with fabrication of the DAC 60.

Figure 3:
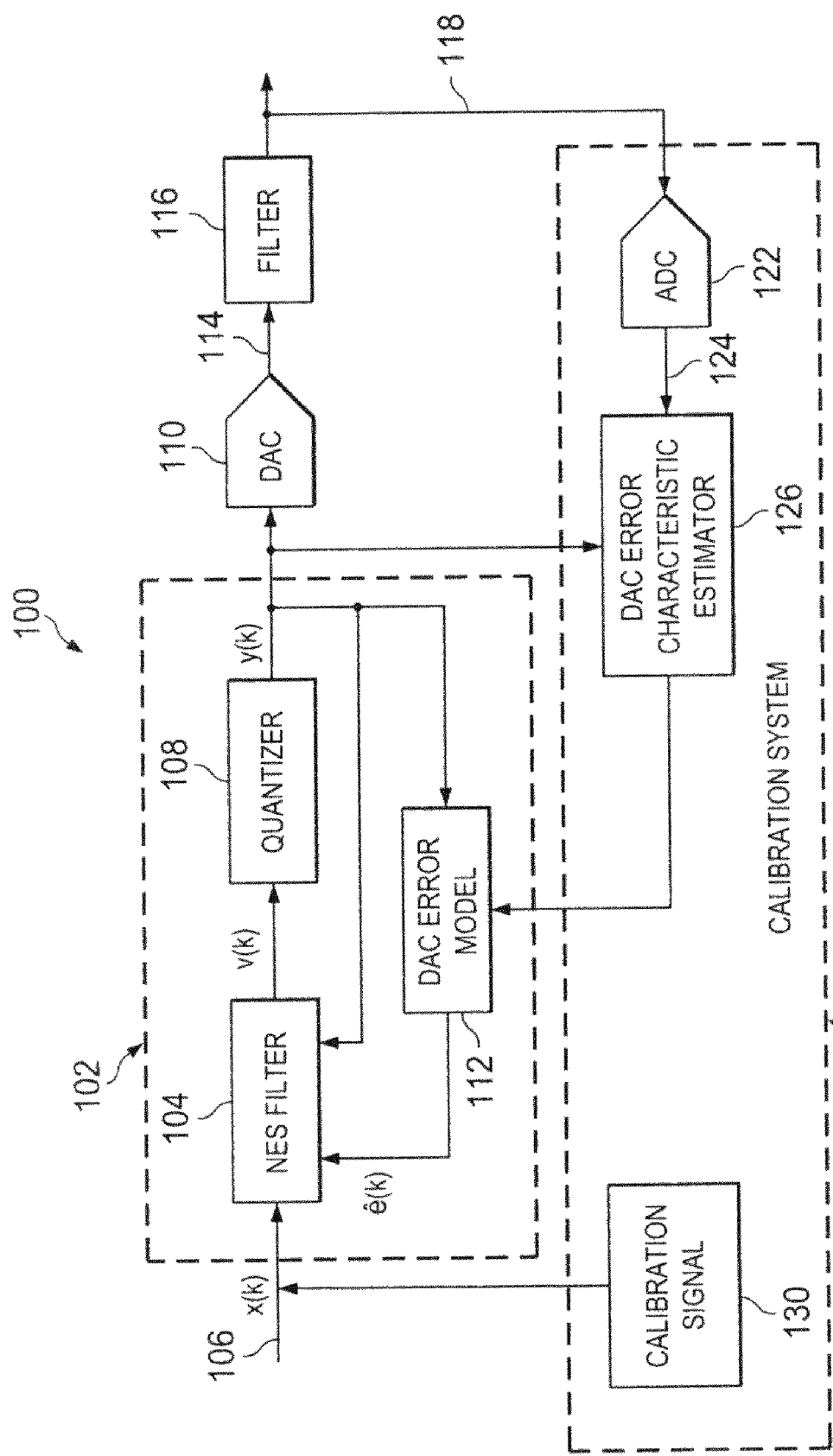
FIG. 3 is an example of a digital-to-analog converter system and model calibration system in accordance with an aspect of the present invention.

FIG. 3 illustrates an example of a digital-to-analog conversion system 100 in accordance with an aspect of the present invention. The system 100 includes a noise and error shaping system 102 that receives an input signal x(k) at an associated input 106. The module 102 is substantially similar to the module 54 shown and described with respect to FIG. 2.

Briefly stated, the module 102 includes a NES filter 104 that receives the input signal x(k) at an input 106 and provides a corresponding filtered output signal v(k) to a quantizer 108. The quantizer 108 quantizes the digital filtered signal v(k) into a corresponding digital output signal y(k) having a predetermined number of quantization levels. The quantized output signal y(k) is provided to a DAC 110 as well as to an input of the NES filter 104 and to a DAC error model 112. The DAC error model 112 provides an emulated error signal ê(k) to another input of the NES filter 104 as a function of the quantized signal y(k). The DAC error model 112 is adaptively calibrated to include parameters that emulate error characteristics associated with the DAC 110 based on the level indicated by the quantized signal y(k).

The DAC 110 converts the quantized signal y(k) to a corresponding analog signal 114. The analog signal 114 is provided to an input of an analog filter 116 that provides a filtered output signal at 118. For example, the filter 116 is a low-pass filter that is operative to remove quantization noise as well as other out-of-band frequency components and noise. For example, the NES filter 104 and quantizer 108 are operative to shift noise to out-of-band frequencies so that the filter 116 can more easily remove the out-of-band frequency components and thereby provide a high precision analog representation of the signal at 118.

The filtered output signal at 118 is also provided to a calibration system 120. The calibration system 120 is programmed and/or configured to adaptively calibrate or program the DAC error model 112 to emulate error characteristics associated with the DAC 110. For example, the calibration system 120 operates during a calibration mode of the system 100 to program the DAC error model 112 to emulate error characteristics of the DAC 110. The calibration system 120 can program the DAC error model 112 based on the analog signal 114 provided by the DAC 110 (e.g., based on inband frequency content of the signal). During normal operation (e.g., a normal mode), the DAC error model 112 can have fixed parameters. The DAC error model 112 provides the emulated error signal ê(k) to the NES filter 104 to efficiently and effectively mitigate the associated errors applied by the DAC 110.

Turning now to the contents of the calibration system 120, the filtered output signal 118 is provided to an ADC 122. The ADC 122 converts the analog filtered signal 118 to a corresponding digital representation thereof, indicated at 124. The digital signal 124 is provided a DAC error characteristic estimator 126. The DAC error characteristic estimator 126 also receives the input signal y(k) that is provided to an input of the DAC 110. In the calibration mode, the DAC error characteristic estimator 126 adapts parameters of the DAC error model 112 until the error in the signal at 118 is sufficiently minimized, which corresponds to model calibration. At this point, the DAC error model 112 can become fixed for normal operation of the system 100. The adaptation can be for a fixed number of samples (e.g., a predetermined time period) or continue until the error in the signal at 118 is within an acceptable level.

Those skilled in the art will understand and appreciate that the arrangement of the system 100 enables use of an ADC 122 having a low dynamic range (e.g., an inexpensive ADC). In particular, the calibration system 120 can be operative to provide a calibration signal, schematically indicated at 130, to the input 106 during the calibration mode. The calibration signal 130 can be a signal having little or no energy at in-band frequencies. For example, the calibration signal 130 can be zero or a high frequency sinusoidal tone. While the calibration signal 130 is illustrated as part of the calibration system, those skilled in the art will understand and appreciate that an appropriate DSP or baseband modulator (not shown) can be operative to provide the calibration signal 130 having appropriate frequency content to facilitate calibration of the system 100 in accordance with an aspect of the present invention.

Since the calibration signal 130 contains little or no energy at in-band frequencies, the filter 116 can effectively remove out-of-band quantization errors and remove the spectrum of the calibration signal. For example, quantization error has been suppressed by the noise transfer function associated with the NES module 102 and little or no frequency components exist from the calibration signal at the output 118. As a result, the filtered output signal at 118 provided by the filter 116 may contain substantially only the in-band frequency components of the signal from the DAC 110 and suppressed quantization error, namely, a low-level residual error signal.

This allows the ADC 122 to employ the full signal range for the residual error signal from the filter 116. Therefore, as the DAC error characteristic estimator 126 adapts parameters of the DAC error model 112 to provide a high precision estimate of the DAC error during the calibration mode, the output signal at 118 from the filter 116 will minimize. As the output signal approaches zero (or other low error threshold), the model parameters converge and the DAC error model 112 can be considered adequately calibrated to emulate the DAC error. Thus, normal operation of the system can begin.

Figure 4:
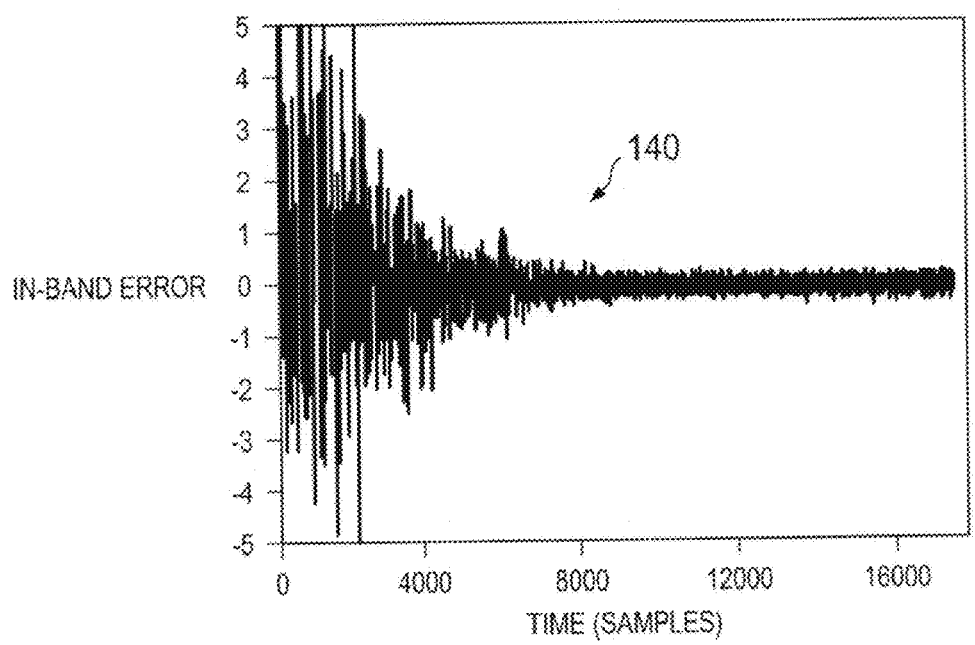
FIG. 4 is a graph depicting an error signal during model calibration in accordance with an aspect of the present invention.

FIG. 4 illustrates a plot of an in-band error signal 140 associated with a calibration mode of the system 100 in accordance with an aspect of the present invention. Referring between FIGS. 3 and 4, the in-band error 140 is shown to decrease as a function of time until the error stabilizes near zero. In this example, the in-band error 140 is shown to minimize between about 8,000 and about 10,000 samples. The minimization of the in-band error 140 corresponds to the DAC error model 112 more closely approximating the characteristics of the DAC error. Thus, those skilled in the art will understand and appreciate that the DAC error model 112 can be adjusted or adapted by the DAC error characteristic estimator 126 for a fixed predetermined period of time, such as a predetermined number of samples. Alternatively or additionally, the model 112 can be adapted until the error has decreased to within an acceptable range of error (e.g., a percentage of error).

By way of example, the parameter of the DAC error model 112 can be stored as an error vector that defines the error characteristic of the DAC 110. More particularly, the error vector can include coefficients that define error characteristics, such as including error associated with the respective quantization levels of the DAC 110. For example, by performing the DAC characteristic estimation algorithm in a manner similar to the well known LMS algorithm, the error coefficients can be adapted in parallel as a function of the error signal provided at 118 by the filter 116 during the calibration mode. The adaptive algorithm enables the error coefficients to converge near the actual error coefficients associated with non-linearities of the DAC 110.

Figure 5:
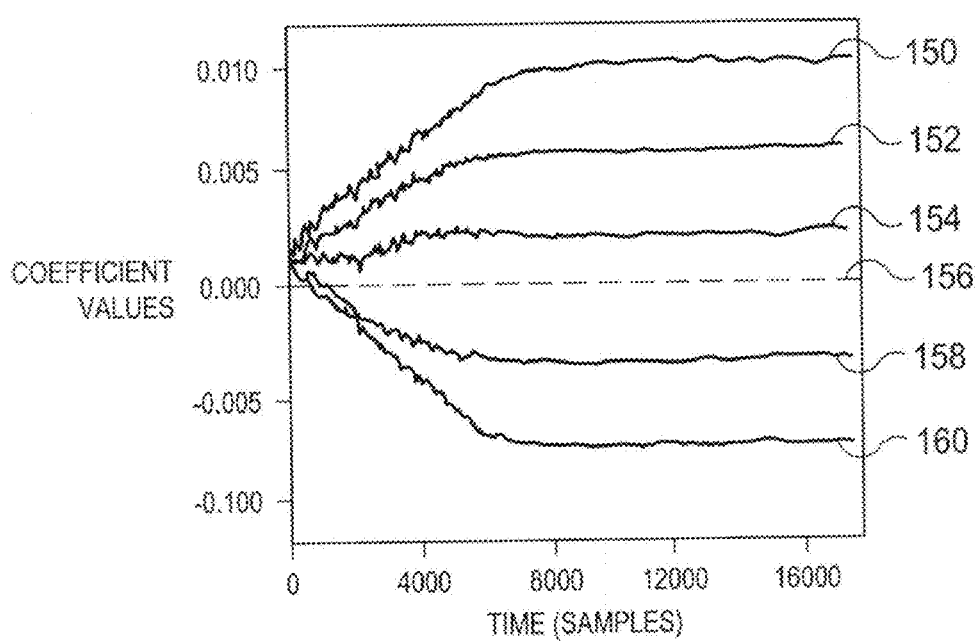
FIG. 5 is a graph depicting a feature of model calibration in accordance with an aspect of the present invention.

FIG. 5 illustrates an example of error coefficient values for a DAC error model having six error parameters. The error parameter 156 is fixed and chosen as a reference for the other five parameters 150, 152, 154, 158 and 160. As shown in FIG. 5 and with reference back to the system 100 of FIG. 3, each of the error coefficients 150, 152, 154, 158 and 160 converges to an associated value under adaptation of the DAC error model 112. The estimated coefficients 150, 152, 154, 158 and 160 correspond to respective bit-signals provided to the DAC 110. The coefficients 150-160 define the estimated error signal ê(k) that is provided to the NES filter 104 as a function of the input signal y(k) to the DAC. Referring between FIGS. 4 and 5, it is shown that the error coefficients 150-160 settle to corresponding values commensurate with the minimization of the in-band error 140. That is, as the model 112 provides a more precise estimate of the DAC error, the coefficients converge and the in-band error decreases accordingly.

Figure 6:
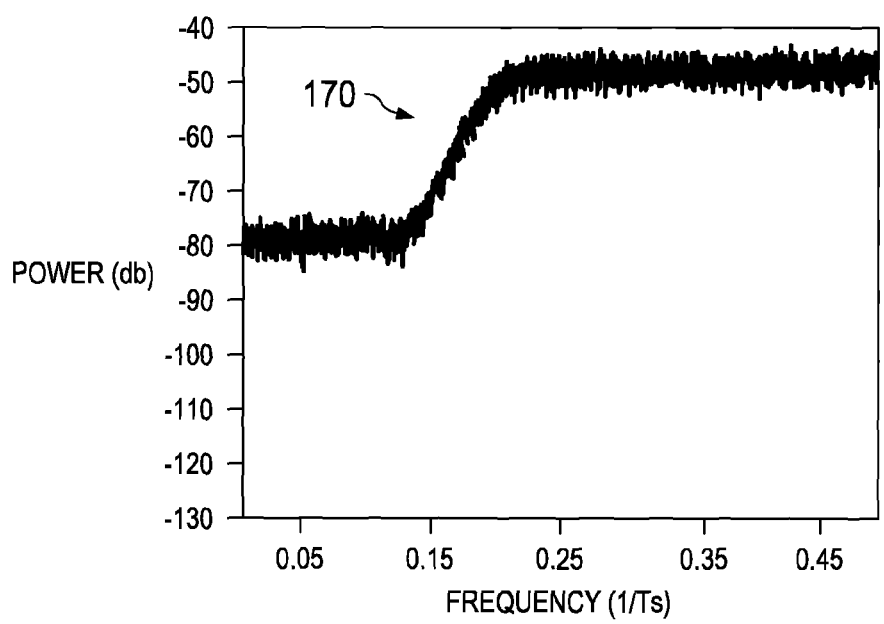
FIG. 6 is a graph depicting a frequency spectrum for an output for an uncalibrated DAC.
Figure 7:
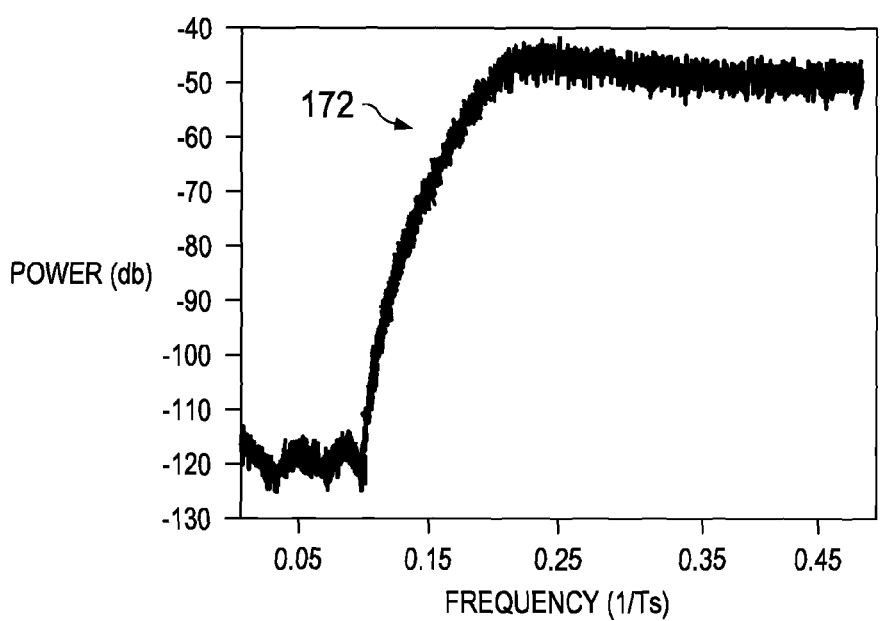
FIG. 7 is a graph depicting a frequency spectrum for a DAC calibrated in accordance with an aspect of the present invention.

FIG. 6 illustrates a spectrum 170 of a DAC output for an uncalibrated system. By way of comparison, FIG. 7 shows the spectrum 172 for a comparable the DAC system that has been calibrated in accordance with an aspect of the present invention. As depicted in FIGS. 6 and 7, the in-band frequency range is from about 0 to about 0.1 of the sample frequency (defined by $1/T_s$), and the reduction of the in-band noise power due to the calibration is approximately 39.1 dB.

Figure 8:
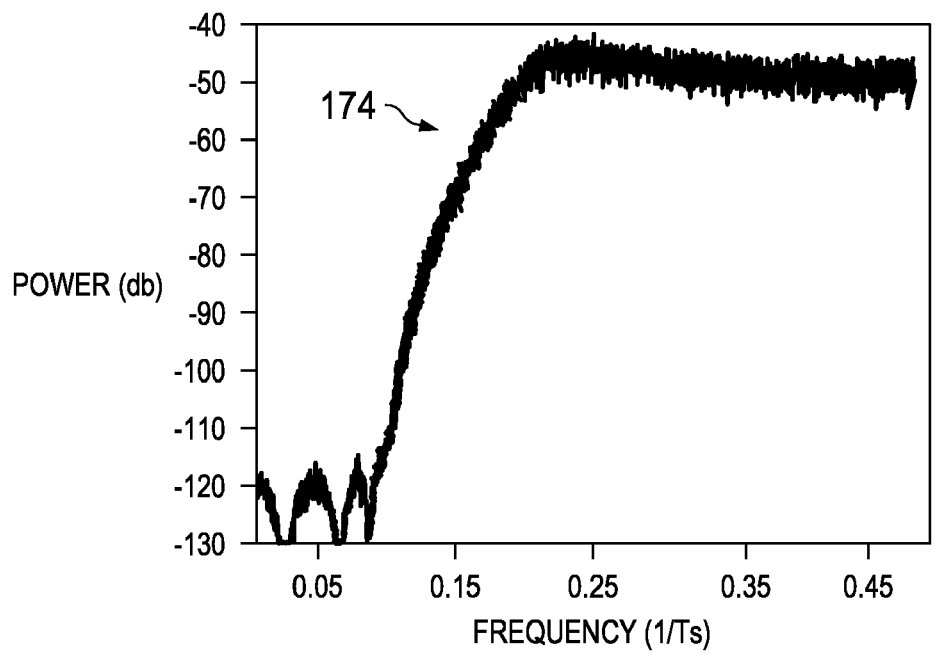
FIG. 8 is a graph depicting a frequency spectrum for an ideal DAC.

For further comparison, FIG. 8 depicts a spectrum 174 of a DAC output for a simulation run for a comparable ideal DAC element (e.g., $e_c$=[0 0 0 0 0 0]). The spectrum 174 in this case is given by the quantization error and dither, which are spectrally shaped by the noise transfer function of the DAC system. The in-band noise power is approximately 4.4 dB lower for the ideal DAC, compared to a system implementing a DAC error model calibrated in accordance with an aspect of the present invention. The slightly higher in-band noise power in the calibrated system is mainly due to the small deviation in the estimated error parameters. The in-band noise power can be reduced if the error parameters are estimated better, which can be done by using a longer calibration time and a reduced step size in the DAC characteristic algorithm, as described herein (see, e.g., FIG. 12).

Figure 9:
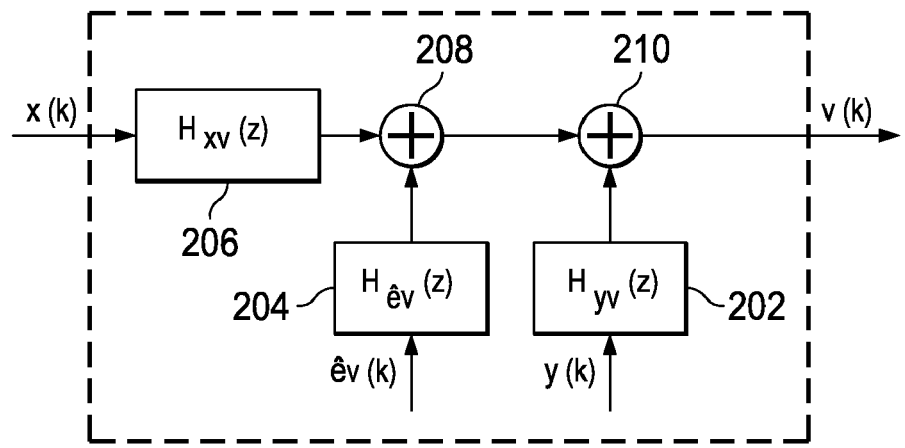
FIG. 9 is a block diagram of a transfer function representation for noise shaping that can be employed to facilitate modeling in accordance with an aspect of the present invention.

FIG. 9 depicts a block diagram of a transfer function for a digital NES filter represented in the z-domain, indicated at 200. As depicted in FIG. 9, the NES filter 200 can be represented as three open-loop transfer functions $H_{yv}(z)$, $H_{êv}(z)$ and $H_{xv}(z)$ indicated respectively as 202, 204 and 206. A digital input signal (e.g., pulse code modulated input) x(k) is provided as the input to the function $H_{xv}(z)$ 206, which provides a corresponding output to a summer 208. The summer 208 adds the output of $H_{xv}(z)$ to a processed error signal provided by the function $H_{êv}(z)$. The function $H_{êv}(z)$ derives the output as a function of the emulated error signal ê(k), such as provided by a DAC error model in accordance with an aspect of the present invention. The summer 208 provides its summed output to another summer 210 that adds the output from 208 with a signal functionally related to the output signal y(k) by the transfer function $H_{yv}(z)$. This results in a corresponding signal v(k) that can be provided as an input to a quantizer.

Figure 10:
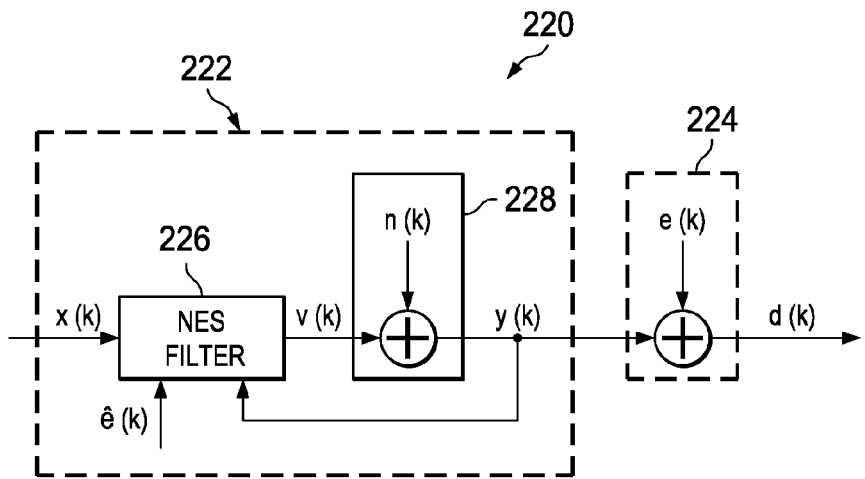
FIG. 10 is a block diagram of a transfer function representation for digital-to-analog conversion that can be employed to facilitate modeling in accordance with an aspect of the present invention.

FIG. 10 depicts a digital representation of a conversion system 220 that includes a representation of a NES system 222 and a DAC model 224. In particular, the NES system 222 includes a model of a NES filter 226, such as the filter representation 200 shown and described with respect to FIG. 9. The NES filter 226 provides the signal v(k) to a model of a quantizer, indicated at 228. In this example, the quantization error n(k) is assumed uncorrelated to the signal v(k) that is input to the quantizer 228. Thus, in this case, the quantization error n(k) can be modeled as a separate additive random noise signal that is added to the input signal v(k) to provide a quantized output signal y(k). The quantizer 228 provides the quantized signal y(k) to the DAC model 224.

With respect to the DAC model 224, the DAC error e(k) can be modeled as a separate additive random error signal, as shown at 224. The DAC error e(k), for example, corresponds to non-linearities in the DAC, such as can arise from component mismatch due to, for example, process variations. The DAC model 224 thus adds the DAC error e(k) to the quantized signal y(k) to provide the output d(k).

Those skilled in the art will appreciate that, in view of the above assumptions, the system model 220 represented in FIG. 10 is substantially linear. Thus, the noise transfer function NTF(z) from the quantization error N(z) to the DAC output D(z) can be expressed as follows:

$$NTF(z) = \frac{D(z)}{N(z)} = \frac{1}{1 - H_{yv}(z)} \qquad \text{Eq. 1}$$

Since the NTF(z) is the transfer function of the quantization error to the DAC output, the NTF(z) is desired to minimize at in-band frequencies to suppress the quantization error. From Eq. 1, it follows that the magnitude of NTF(z) is small when the gain in $H_{yv}(z)$ is high. Consequently, high gain in $H_{yv}(z)$ is desired at in-band frequencies.

From FIGS. 6 and 7, the transfer function $H_{xd}(z)$ from the input signal X(z) to the DAC output D(z) can be expressed as follows:

$$H_{xd}(z) = \frac{H_{xv}(z)}{1 - H_{yv}(z)} \qquad \text{Eq. 2}$$

This transfer function is usually desired to be unity, which provides that:

$$H_{xv}(z) = 1 - H_{yv}(z) \qquad \text{Eq. 3}$$

Additionally, from FIGS. 6 and 7, the transfer function $H_{\hat{e}d}(z)$ from the estimated DAC error $\hat{E}(z)$ to the DAC output D(z) can be expressed as follows:

$$H_{\hat{e}d}(z) = \frac{D(z)}{\hat{E}(z)} = \frac{H_{\hat{e}v}(z)}{1 - H_{yv}(z)} \qquad \text{Eq. 4}$$

From FIGS. 6 and 7 and the transfer functions provided above in Eqs. 1-4, the z-transform of the DAC output D(z) becomes:

$$D(z) = X(z)H_{xd}(z) + N(z)NTF(z) + \hat{E}(z)H_{\hat{e}d}(z) + E(z) \qquad \text{Eq. 5}$$

From Eq. 5, it follows that optimal suppression of E(z) can be achieved when the transfer function $H_{\hat{e}d}(z) = -1$. Where $H_{\hat{e}d}(z) = -1$, the contribution from the DAC error E(z) in the DAC output D(z) cancels completely when the estimated DAC error $\hat{E}(z)$ equals the true DAC error E(z). In practice, however, it is not feasible to realize a system where $H_{\hat{e}d}(z) = -1$. This is because $H_{\hat{e}d}(z)$ has one or more associated sample delays that operate to prevent an algebraic loop in the system (e.g., a loop with no delay).

It will be appreciated that at frequencies where the gain in the transfer function $H_{yv}(z)$ is high (e.g., large in-band gain), $H_{\hat{e}d}(z)$ is approximately minus one when $H_{\hat{e}v}(z)$ equals $H_{yv}(z)$, which is a possible realization of $H_{\hat{e}v}(z)$. That is, for large in-band gain, $H_{\hat{e}d}(z)$ can be expressed as follows:

$$H_{\hat{e}d}(z) = \frac{H_{\hat{e}v}(z)}{1 - H_{yv}(z)} = \frac{H_{yv}(z)}{1 - H_{yv}(z)} \approx -1, \quad |H_{yv}(z)| \gg 1 \qquad \text{Eq. 6}$$

In the special case where the emulation of the DAC error is ideal, namely, where $\hat{e}(k) = e(k)$ and $H_{\hat{e}v}(z) = H_{yv}(z)$, the z-transform D(z) of the DAC output becomes:

$$D(z) = X(z)H_{xd}(z) + N(z)NTF(z) + E(z)ETF(z) \qquad \text{Eq. 7}$$

and the error transfer function ETF(z) can be expressed as follows:

$$ETF(z) = 1 + H_{\hat{e}d}(z) = \frac{1}{1 - H_{yv}(z)} = NTF(z) \qquad \text{Eq. 8}$$

Thus, where the emulated DAC error $\hat{e}(k)$ is identical to the true DAC error e(k), the errors N(z) and E(z) have the same transfer function to the output of the DAC when $H_{yv}(z)$ equals $H_{\hat{e}v}(z)$. Consequently, both of the errors N(z) and E(z) in this case can be suppressed at frequencies where the gain in $H_{yv}(z)$ is high. Those skilled in the art will understand and appreciate various types of noise and error shaping systems that can be utilized in a conversion system implemented according to an aspect of the present invention. Examples of noise and error shaping systems can be found in "Digitally Corrected Multi-Bit ΣΔ Data Converters" by Cataltepe, T. et al (1989 IEEE), "Delta-Sigma Data Converters" by Norsworthy, Steven R. et al. (1997 IEEE Press) and "A New Method for Linearisation of a Classical-Type D/A Converter" by Knudsen, Niels O. et al. (1995 AES).

In view of the above, those skilled in the art will understand and appreciate various implementations for a DAC error model in accordance with an aspect of the present invention. For example, the DAC error model can be implemented as a look-up table or other device (e.g., memory or DSP) programmed and/or configured to provide an indication of emulated DAC error as a function of the input to the DAC. Depending on the type and configuration of DAC being employed, the emulated DAC error further can vary as a function of one or more previous inputs to the DAC (e.g. y(k−1), y(k−2) etc.). Using one or more previous DAC inputs enables the error model to accommodate dynamic errors that may depend on earlier values of the DAC input signal (e.g., inter-symbol interference). Such dynamic errors generally depend on the topology and timing of the circuit being implemented.

Figure 11:
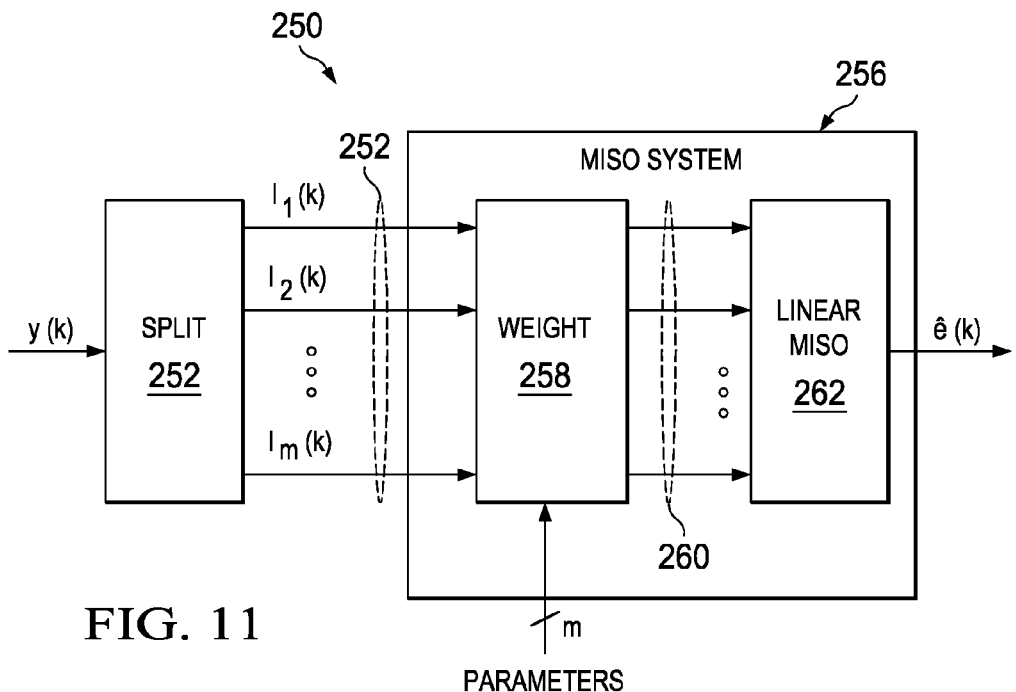
FIG. 11 is a block diagram depicting a model in accordance with an aspect of the present invention.

FIG. 11 illustrates an example of an error model 250 that can be utilized for mitigating errors in a conversion system in accordance with an aspect of the present invention. The model 250 includes a split module 252 that is operative to divide a quantized DAC input signal y(k) into a number of intermediate signals 254. For instance, the split module 252 can be implemented as a look-up table or as other hardware and/or software capable of splitting the input signal y(k) into a desired number of intermediate signals 254.

In the example of FIG. 11, the split module 252 divides the input signal y(k) into m intermediate signals are indicated as $I_1(k), I_2(k), \ldots, I_m(k)$, where m is functionally related to (e.g., equal to) the number of quantization levels (or steps) of the DAC input. For the example of a three bit input signal y(k), there could be up to eight possible quantization levels. The division of the quantization signal y(k) into the m intermediate signals can employ non-linear processing, which is defined for a given converter topology. The intermediate signals 254, which can include a one-bit signal for each of the possible quantization levels, are provided to a multi input single output (MISO) system 256. Those skilled in the art will appreciate that, by careful design of the split function 252, the number m of intermediate signals can be reduced, thereby enabling a more simple MISO system 256. The MISO system 256 is adapted according to an aspect of the present invention to provide an emulated DAC error signal ê(k) based on the intermediate signals 254.

In accordance with one aspect of the present invention, the model 250 can be employed to provide an indication of the emulated DAC error ê(k) assuming no dynamic errors. With no dynamic errors, the true DAC error e(k) can be assumed to depend on only the present input to the DAC y(k). In this case, the actual DAC error e(k) can be adequately described by a substantially memoryless function of the present DAC input y(k). Memoryless here refers to the absence of dependency on one or more previous inputs (e.g., y(k−1), y(k−2) etc.) to the DAC.

A DAC error model without dynamic error modeling can, for example, be realized by a look-up table with a size functionally related (e.g., equal) to the numbers of quantization levels $n_{quant}$ of the input signal y(k) to the DAC. A DAC error model without dynamic error modeling realized by a look-up table has been proposed in the above-identified Cataltepe paper, which is incorporated herein by reference.

In the example of FIG. 11, the MISO system 256 includes a weighting component 258 that provides weighted versions of the intermediate signals 254 based on the estimated error parameters. In this way, each of the DAC error parameters can be used to weight a respective one of the intermediate signals 254 (e.g., there being m parameters). The estimated DAC error parameters can include an estimated error coefficient vector $\hat{e}_C$ stored in a look-up table to provide corresponding emulated error signal ê(k) as a function of the quantization value of the DAC.

The weighted intermediate signals 260 are provided to a linear MISO system 262. The linear MISO system 256 is operative to provide the emulated error ê(k) by combining the weighted intermediate signals 260. The coefficient vector $\hat{e}_C$, for example, defines error coefficients associated with each level of quantization, such as programmed during an adaptive calibration process implemented according to an aspect of the present invention. Those skilled in the art will understand and appreciate various types of MISO systems that can be utilized to weight and aggregate the intermediate signals to provide the emulated error signal ê(k).

By way of further example, the intermediate signals 254 may define an address for a look-up table that stores the values for the estimated coefficient vector $\hat{e}_C$. As mentioned above, each of the intermediate signals $I_1(k), I_2(k), \ldots, I_m(k)$ can represent a respective quantization step (or level) in the DAC, such that one of the intermediate signals $I_1(k)$, $I_2(k), \ldots$ or $I_m(k)$ 254 equals one when y(k) has a value of that corresponding quantization step and the intermediate signal equals zero otherwise. Furthermore, in this case, the MISO system 256 represents the DAC error for each quantization step in a corresponding weight factor applied to the intermediate signal 254.

In view of the foregoing, it will be appreciated that a look-up table provides a convenient realization for at least a portion of a DAC error model since, for a given DAC topology, the input to the DAC y(k) is quantized in a limited number $n_{quant}$ of amplitude levels. In this case, the emulated DAC error has to be stored, indexed by all input values of relevance (e.g. y(k), y(k−1), etc.) to the DAC error. Those skilled in the art will understand and appreciate that if the DAC error model 250 is employed to emulate DAC error that includes an amount of dynamic error characteristics, the dimension of the table 258 increases as a function of the number of input values influencing the DAC error. That is, the number of elements $n_{table}$ to be stored in the table 258 becomes:

$$n_{table} = (n_{quant})^{n_y}, \qquad \text{Eq. 9}$$

where $n_y$ is the number of present and previous input values to the DAC to be used in the error emulation.

The implementation cost associated with a DAC error model tends to increase as a function of the amount of data in a look-up table (e.g., given by Eq. 9), since it affects memory capacity and comprehensive estimation needed for all the values in the look-up table. The concerns are further compounded when dynamic error characteristics are included in the DAC error model. Therefore, it is desirable to reduce the number of parameters in the DAC error model so as to reduce associated memory requirements. Those skilled in the art will appreciate that various efficiencies can be achieved by looking into the nature of the error in a given converter topology.

Figure 12:
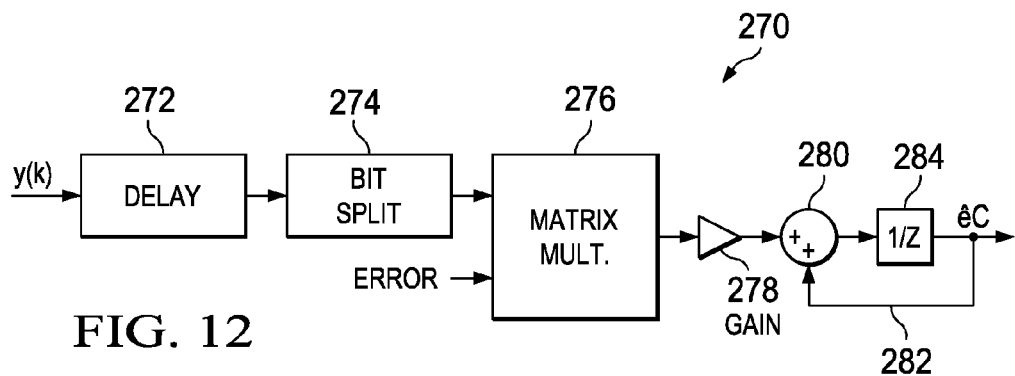
FIG. 12 is an example of a block diagram that can be employed to estimate DAC characteristics in accordance with an aspect of the present invention.

FIG. 12 illustrates an example of a system 270 that can implement an algorithm to estimate parameters for a DAC error model in accordance with an aspect of the present invention. Those skilled in the art will appreciate that this approach is similar to the well-known LMS algorithm; however, this algorithm differs from a standard LMS algorithm because multiple filters (or gain coefficients) are adapted in parallel, based on the error signal from the analog-to-digital converter (e.g., the signal 124 in FIG. 3).

As shown in FIG. 12, an input signal y(k) is received by a delay block 272. The delay block is configured to impose a timing delay (D) that substantially matches the delay in the output signal associated with digital-to-analog conversion and associated filtering. The delayed signal (e.g., y(k−D)) is provided to a bit splitter 274. The bit splitter 274 separates the delayed input signal into a vector of plural intermediate signals. The separation of the delayed signal y(k−D) into the intermediate signals can employ non-linear processing, which can vary for a given converter topology.

A matrix multiplier 276 receives the plural signals from the splitter and the error signal. The error signal, for example, corresponds to digital representation of a filtered analog output signal from the DAC (e.g., the signal at 118 in FIG. 3). The matrix multiplier 276 multiplies the input vector times the value provided in the error signal to provide a corresponding vector product to a vector gain function 278. The vector gain function 278 is configured to implement a desired gain on each of the elements in the vector product. The vector gain function influences on the step size of the parameter update and can be programmed for a given application.

The vector gain function 278 provides the gained vector product to a summing function 280. The summing function 280 also receives as an input a previous estimated error coefficient vector $\hat{e}_C$, indicated as feedback vector signal 282. The summer 280 adds the vector signal 282 to the gained vector product from the vector gain function 278. The summer provides the vector sum to a delay block 284, which can implement a one-sample delay on the vector sum, to provide the estimated error coefficient vector $\hat{e}_C$ for a DAC error model.

Those skilled in the art will understand and appreciate that the system described with respect to FIG. 12 illustrates but one example of an algorithm that can be utilized to estimate coefficients for a DAC error model. Those skilled in the art will appreciate various other approaches that can be utilized, all of which are contemplated as falling within the scope of the appended claims.

Figure 13:
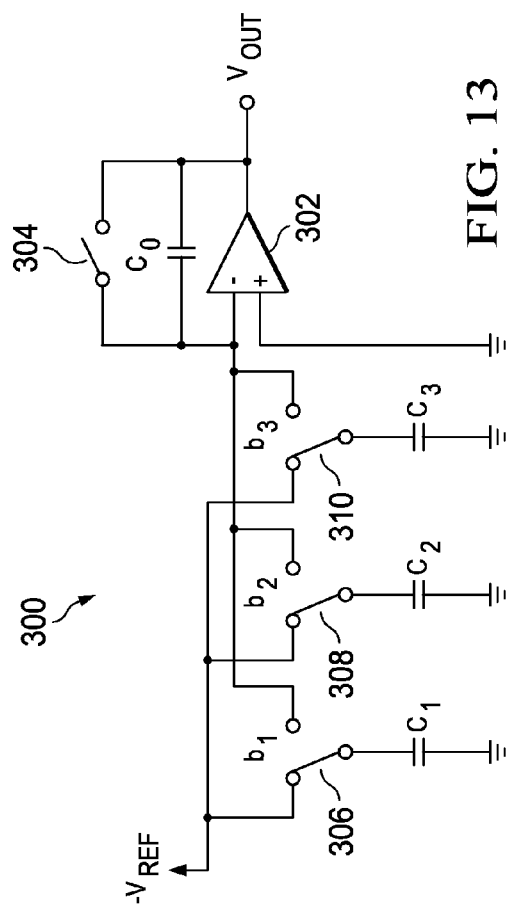
FIG. 13 is an example of a circuit diagram of a digital-to-analog converter that can be utilized in accordance with an aspect of the present invention.

To further understand the types of DAC characteristics that can be parameterized in a DAC error model, FIG. 13 depicts an example topology for a simple 3-bit DAC 300 that can be implemented in a conversion system according to an aspect of the present invention. The DAC 300 includes an operational amplifier 302 that provides an analog output $V_{OUT}$. A reference capacitor $C_0$ is coupled between the inverting input and output of the amplifier in parallel with a switch 304. The non-inverting input is grounded.

The inverting input is coupled to a parallel arrangement of capacitors $C_1$, $C_2$ and $C_3$, which are matched (e.g., proportional) relative to the reference capacitor and/or to each other. Each of the capacitors $C_1$, $C_2$ and $C_3$ are coupled between ground and corresponding switches 306, 308 and 310. Each of the switches 306, 308 and 310 is operative to connect the capacitors $C_1$, $C_2$ and $C_3$ to either a reference voltage $-V_{REF}$ or to the inverting input of the amplifier 302. The operation of the switches 306, 308 and 310 is controlled based on a 3-bit sample code ($b_1$, $b_2$, $b_3$), each bit controlling operation of a respective one of the switches 306, 308, 310. The DAC 300 thus operates to convert the sample code into the corresponding analog voltage $V_{OUT}$.

The conversion process occurs during two timing periods $\phi 1$ and $\phi 2$ for each sample, which influences on the state of the switches 306, 308 and 310. For example, in the first period $\phi 1$, the switches 306, 308 and 310 operate in a first condition so that the capacitors $C_1$, $C_2$ and $C_3$ are charged to $-V_{REF}$, and the capacitor $C_0$ is discharged. Depending on the value of the sample code bits $b_1$, $b_2$ and $b_3$, corresponding switches 306, 308, 310 are activated to transfer their charge to the capacitor $C_0$ in the period $\phi 2$. This results in the corresponding analog output voltage $V_{OUT}$.

As mentioned above, the DAC 300 has error characteristics, such as associated with non-linearities due to mismatching in the capacitances of $C_1$, $C_2$ and $C_3$. $\epsilon_1$, $\epsilon_2$ and $\epsilon_3$ are error terms in the capacitance of $C_1$, $C_2$ and $C_3$ relative to $C_0$. The error terms $\epsilon_1$, $\epsilon_2$ and $\epsilon_3$, for example, correspond to errors resulting from process variations, process conditions, or performance requirements associated with fabrication of the DAC 300. For example, in a binary weighted network of capacitors $C_1$, $C_2$ and $C_3$, $C_1 = \frac{1}{2}C_0$, $C_2 = \frac{1}{2}C_1$ and $C_3 = \frac{1}{2}C_2$. Thus, the error terms $\epsilon_1$, $\epsilon_2$ and $\epsilon_3$ can represent mismatch errors related to the areas of each of the capacitors $C_1$, $C_2$ and $C_3$ relative to $C_0$.

In the DAC topology in FIG. 13, the output voltage $V_{OUT}$ in the period $\phi 2$ can be expressed as follows:

$$V_{out} = \frac{V_{ref}}{C}(C_1 b_1 + C_2 b_2 + C_3 b_3) = V_{ref}(k \cdot b + e_C \cdot b), \quad \text{Eq. 10}$$

where $k = [2^{-1}, 2^{-2}, 2^{-3}]$,
$e_C = [\epsilon_1, \epsilon_2, \epsilon_3]$ and
$b = [b_1, b_2, b_3]^T$.

From Eq. 10, the desired ideal output voltage $V_{ideal}$ (e.g., assuming no associated error) is recognized to be:

$$V_{ideal} = V_{ref} k \cdot b, \quad \text{Eq. 11}$$

It follows that the error in the output voltage $V_{err}$ can be expressed as follows:

$$V_{err} = V_{ref} e_C \cdot b \quad \text{Eq. 12}$$

A DAC error model that describes the errors from mismatch of the capacitors $C_1$, $C_2$ and $C_3$ in the topology of FIG. 13 is consequently given by Eq. 12. In this case, the parameters of a DAC error model are functionally related to the error terms $\epsilon_1$, $\epsilon_2$ and $\epsilon_3$ of the values of the capacitors $C_1$, $C_2$ and $C_3$. As described herein, the error terms $\epsilon_1$, $\epsilon_2$ and $\epsilon_3$ can be efficiently stored in a look-up table as an error coefficient vector according to an aspect of the present invention. Those skilled in the art will appreciate that modeling the error associated with capacitance mismatch in a DAC having a binary weighted capacitor network can be performed by a simpler representation of DAC error than having a DAC error for each quantization step.

In view of the foregoing, those skilled in the art will further appreciate that use of the DAC error model programmed according to capacitive error terms in the DAC 300 allows efficient use of binary weighted capacitors in a DAC topology. In general, a DAC employing binary weighted capacitors can be implemented more cost effectively and require less real estate on an integrated circuit (IC) than a comparable DAC implemented with uniformly weighted capacitors. This is to be contrasted with many conventional error correction models that use one error parameter per quantization step regardless of the inherent structure of the DAC error. This approach typically causes significant overhead in the number of error parameters, and furthermore the estimation process becomes more complicated due to an increased number of parameters. Advantageously, a DAC error model according to the present invention can, for example, mitigate such capacitive errors efficiently and cost effectively without a substantial increase in overhead for the number of error parameters.

It will be understood and appreciated that the present invention is in no way intended to be limited to any particular DAC topology, however. For example, the present invention is equally applicable to DAC topologies employing uniformly weighted and binary weighted components. Additionally, a DAC having any number of one or more quantization levels can be utilized.

As mentioned above, the DAC error model can be calibrated in the digital domain. Thus, to convert the analog output signal to a corresponding digital signal for use in connection with calibrating the error signal, various types of ADCs can be utilized. For example, a single-bit or a multi-bit ADC can be used.

In the example of FIG. 3, the analog output signal 118 is provided by a low pass analog filter 116 for processing by the ADC 122. By employing a calibration signal 130 without energy for in-band frequencies, the linearity of the ADC 122 becomes less critical for use in calibrating the error model. This is because the dynamic range of the ADC 122 is used on a small residual error from an analog filter 116. Consequently, an extremely low dynamic range, low pass ADC can be utilized to derive a digital representation of the error signal during calibration. For example, a simple sign detector implemented by a comparator might be used. Alternatively, the present invention can take advantage of and utilize an existing ADC in the circuitry during calibration of the DAC error model. Those skilled in the art will understand and appreciate that other low cost ADC implementations can also be utilized in accordance with an aspect of the present invention. While the foregoing description has appeared to focus on error models and calibration techniques for over sampled DAC systems, those skilled in the art will understand and appreciate that the present invention also provides an attractive approach correcting errors in an over-sampled ADC system.

Figure 14:
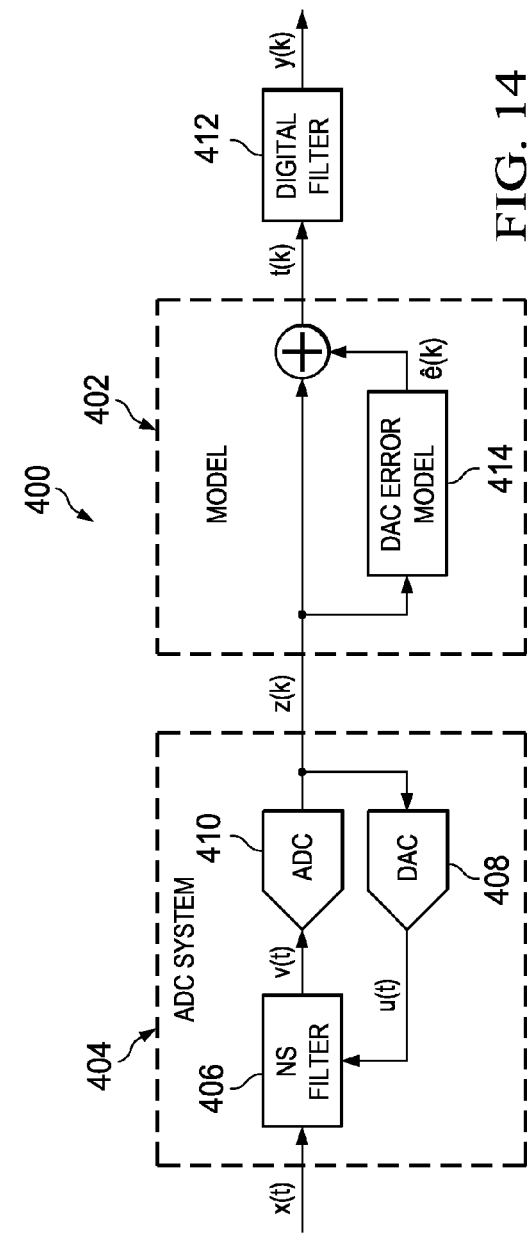
FIG. 14 is an example of an analog-to-digital converter system in accordance with an aspect of the present invention.

FIG. 14 illustrates an example of an ADC system 400 implementing an error model 402 adaptively calibrated to correct errors in the conversion system according to an aspect of the present invention. An analog input signal x(t) is input to a noise-shaping ADC 404. Those skilled in the art will understand and appreciate various topologies and configurations of noise-shaping ADCs that can take advantage of the error correction techniques described herein.

In the example of FIG. 14, the analog input signal x(t) is provided to a noise-shaping filter 406. The noise-shaping filter 406 also receives an analog signal u(t) from a DAC 408. The DAC 408 can be a single-bit DAC or a multi-bit DAC, for example, that introduces errors due to non-linearities or other error characteristics associated with the DAC. The noise-shaping filter 406 provides an output signal v(t) to an associated ADC 410. For example, the ADC 410 is a multi-bit ADC configured to convert the signal v(t) to a corresponding digital signal z(k). The digital output signal from the ADC 410 z(k) also is fed to the DAC 408. Those skilled in the art will understand and appreciate that the loop formed by the noise-shaping filter 406, ADC 410 and DAC 408 forms a traditional over-sampled, noise-shaping ADC. The noise-shaping ADC 404 is designed to achieve desired noise-shaping and signal transfer function characteristics from the analog input x(t) to the output of the ADC 410 z(k).

At in-band frequencies, the loop gain in the noise-shaping ADC 404 is typically high. This makes the in-band spectrum of the signal u(t) from the DAC 408 substantially identical to the in-band spectrum of the analog input signal x(t). Therefore, the output of the ADC 410 z(k) is a signal, which when mapped through the non-linear DAC 408, results in an in-band spectrum substantially equal to the in-band spectrum of the input signal x(t). That is, an in-band spectrum substantially equal to the in-band spectrum of x(t) can be achieved by mapping z(k) through a digital model 402 of the non-linear DAC 408. The model 402 is operative to remove error characteristics associated with the DAC 408. The model thus provides a signal t(k) to, for example, a digital filter 412 that is operative to remove out-of-band frequency components and other noise associated with the conversion process. The digital filter 412 provides a digital signal y(k), which passes the in-band frequencies and diminishes other frequencies so as to substantially reduce noise and other out-of-band signal content.

The model 402 can be implemented similar to the approach described herein for the calibrated DAC system. For example, the model 402 can be implemented by employing a DAC error model 414 that has been programmed to emulate error characteristics of the non-linear DAC 408. As described above, the error characteristics, for example, can correspond to compensative errors (e.g., capacitor mismatch errors) associated with the topology of the DAC 408. For example, the DAC error model 414 can be implemented as a look-up table that is indexed by z(k) to inject a corresponding emulated error signal operative to cancel DAC errors in z(k). The emulated error signal provided by the model 414 thus varies as a function of the quantization level of the input z(k) to the DAC 408. The emulated error signal is then combined with the signal z(k) to provide the digitally corrected signal t(k).

Those skilled in the art will appreciate that when the error model 402 is accurate, the in-band part of the output signal y(k) will substantially match the in-band part of the analog input signal x(t). As a result of the digital correction provided by the model 402, a very linear ADC system 400 can be obtained in accordance with an aspect of the present invention.

Figure 15:
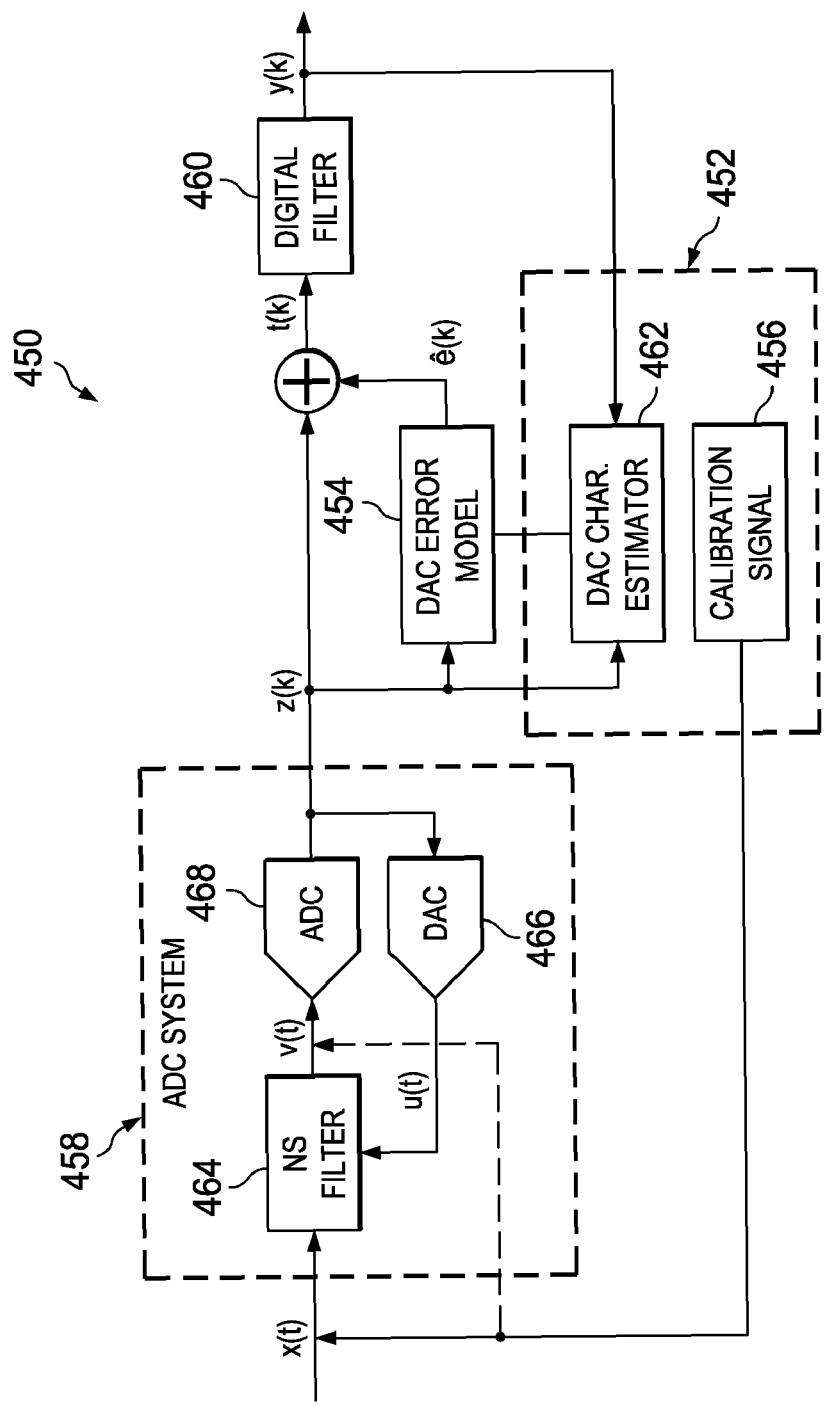
FIG. 15 is an example of an analog-to-digital converter and model calibration system in accordance with an aspect of the present invention.

FIG. 15 is an example of a conversion system 450 that includes a calibration system 452 operative to generate or calibrate a DAC error model 454 in accordance with an aspect of the present invention. The calibration system 452 also may be operative to provide a calibration signal 456 during a corresponding calibration mode of the system 450. The calibration signal is an analog signal, for example, without energy at in-band frequencies. The calibration signal 456 thus is provided to the input of the noise-shaping ADC system 458 during the calibration mode, which results a corresponding digital output signal z(k). Alternatively the calibration signal can be added inside the ADC system 458 at the input of the ADC 468 (indicated by a dotted line), which provides a transfer function from the calibration signal to the output of the ADC system z(k) substantially equal to the noise transfer function. The DAC error model 454 introduces an emulated error signal ê(k) that is added to z(k) to provide a compensated digital output signal t(k). The compensated output signal t(k) is provided to a digital filter 460 to remove out-of-band components to provide a filtered digital output signal y(k) defining a residual error signal that is provided to the calibration system 452.

In particular, the digital signal y(k) is provided to a DAC error characteristic estimator 462 during a calibration mode of the system 450. The characteristic estimator 462 minimizes the residual error signal by adaptively adjusting parameters in the DAC error model 454, such as by employing a suitable algorithm (e.g., LMS or other adaptive algorithms). For example, the adaptive algorithm provides coarser adjustments to the model parameters during an early part of the calibration mode and finer adjustments during a latter part of the calibration mode, which corresponds to the parameter converging toward their final values. Thus, as the error content minimizes during the calibration mode, the value of y(k) approaches zero. The calibration can be implemented for a fixed number of samples or, alternatively, for a duration sufficient to result in an error that is below a predetermined threshold level. Those skilled in the art will understand and appreciate various ways to operate the calibration system 452 to appropriately calibrate the DAC error models 454, all of which are contemplated as falling within the scope of the present invention.

The noise-shaping ADC 458 is substantially similar to that shown and described with respect to FIG. 12. The noise-shaping ADC 458 includes a noise-shaping filter 464 that receives an analog input signal x(t) as well as an analog feedback signal u(t) from a DAC 466. The feedback from the DAC 466 tends to introduce errors due to associated non-linearities or other error characteristics. The noise-shaping filter 464 provides an output signal v(t) to an associated ADC 468. The ADC converts the signal v(t) to the digital signal z(k). The DAC error model 454 is adaptively programmed (e.g., based on inband frequency content of y(k)) during the calibration mode to introduce the emulated error signal to provide for cross-cancellation of the DAC errors in the signal z(k). That is, the parameters in the DAC error model 454 are incrementally adjusted to better approximate of the DAC error so that during calibration the model parameters converge to values to mitigate associated DAC error characteristics.

Figure 16:
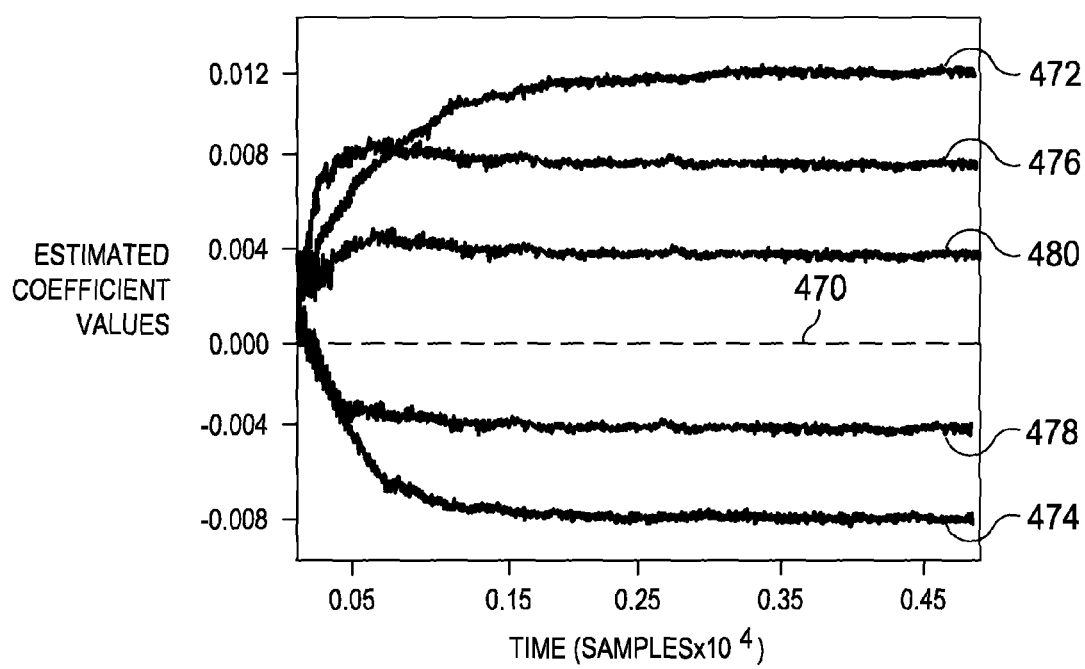
FIG. 16 is a graph depicting a feature of model calibration for use with an analog-to-digital converter in accordance with an aspect of the present invention.
Figure 17:
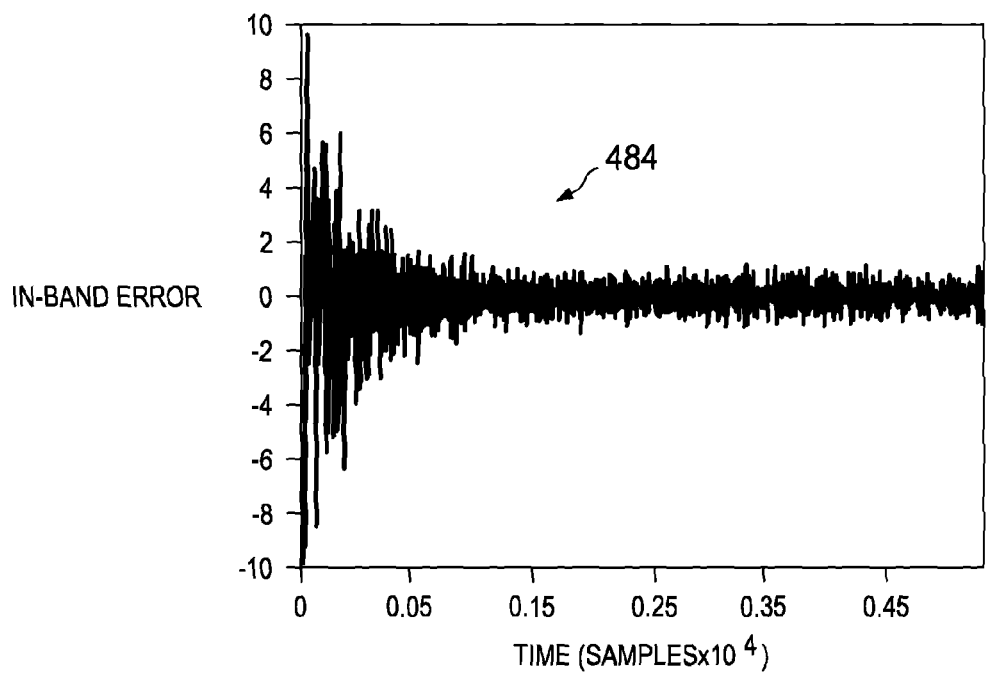
FIG. 17 is a graph depicting an error signal during model calibration in accordance with an aspect of the present invention.

FIG. 16 is a graph of error coefficients as a function of time (in samples) for a DAC error model implemented within an analog-to-digital converter according to an aspect of the present invention. The error parameter 470 is fixed (e.g., depending on the converter topology) and selected as a reference for the other parameters 472, 474, 476, 478 and 480. As depicted in FIG. 16, each of the error coefficients 472, 474, 476, 478 and 480 settles to an associated value under adaptation of the DAC error model 112, for example, close to the actual error coefficients in the DAC. In this example, the DEM coefficients 472, 474, 476, 478 and 480 are sufficiently adapted after approximately 25000 samples. Thus, as the estimated coefficients 472, 474, 476, 478 and 480 approach the correct values, the error signal out of the digital filter (e.g., the filter 460 in FIG. 15) decreases. The decrease in the error signal is illustrated at 484 in FIG. 17.

After the coefficients sufficiently converge, the estimated error parameters can then be fixed and the converter system configured to normal operation mode, using these parameters as part of the model to correct for the DAC error. By way of further example, the estimated error parameters after 25000 samples fitting are:

$$\hat{e}_C = 10^{-3}[0\ 12.03\ -8.15\ 7.86\ -4.04\ 3.90].$$ Eq. 13

Those skilled in the art will appreciate that this approach provides an efficient approach to estimate error coefficients with a high degree of precision.

Simulations are made on the system in normal operation mode with a zero applied on the input, to investigate the spectra at the output of the DAC model (before the digital filter). To see the influence of the calibration, simulations are made before—and after the calibration.

Figure 18:
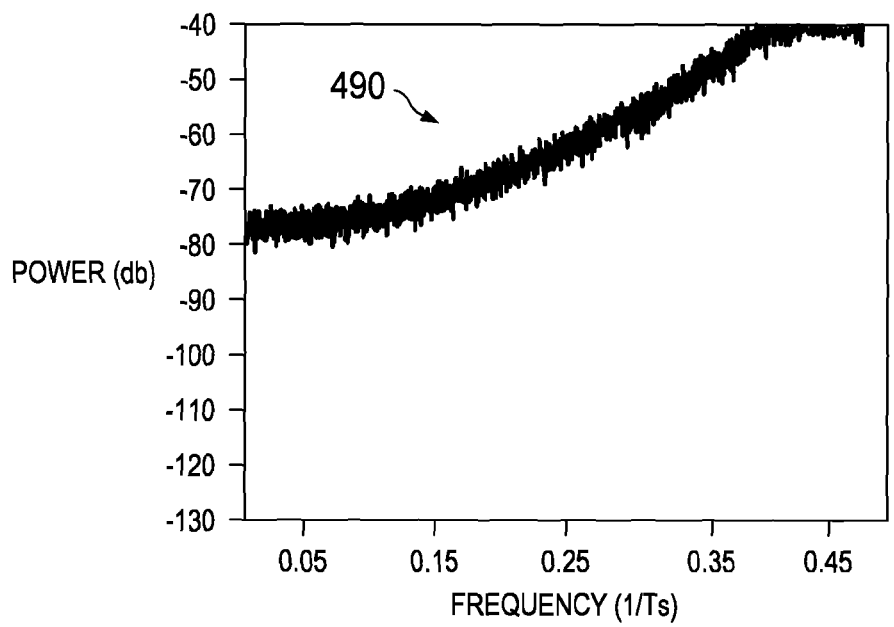
FIG. 18 is a graph depicting a frequency spectrum for an output for an uncalibrated analog-to-digital converter.
Figure 19:
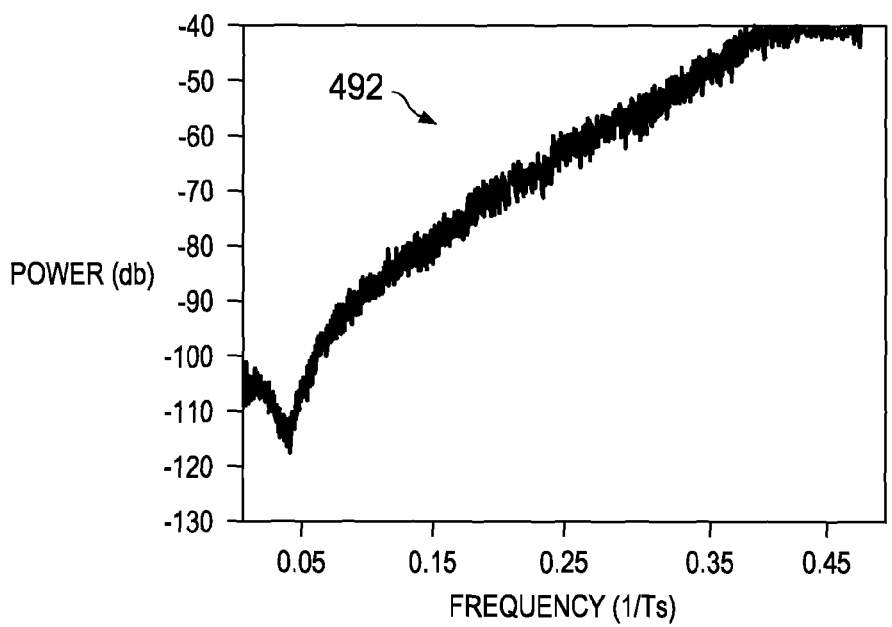
FIG. 19 is a graph depicting a frequency spectrum for an analog-to-digital converter calibrated in accordance with an aspect of the present invention.

FIG. 18 illustrates an example of a spectrum 490 of the output of an uncalibrated analog-to-digital converter. FIG. 19 shows an example of a spectrum 492 for a comparable calibrated analog-to-digital converter system employing a model calibrated in accordance with an aspect of the present invention. In both examples, the in-band frequency range is from 0 to 0.05/Ts. A comparison of the respective spectra 490 and 492 in FIGS. 18 and 19 demonstrates that the reduction of the in-band noise power due to the calibration is approximately 29.2 dB.

Figure 20:
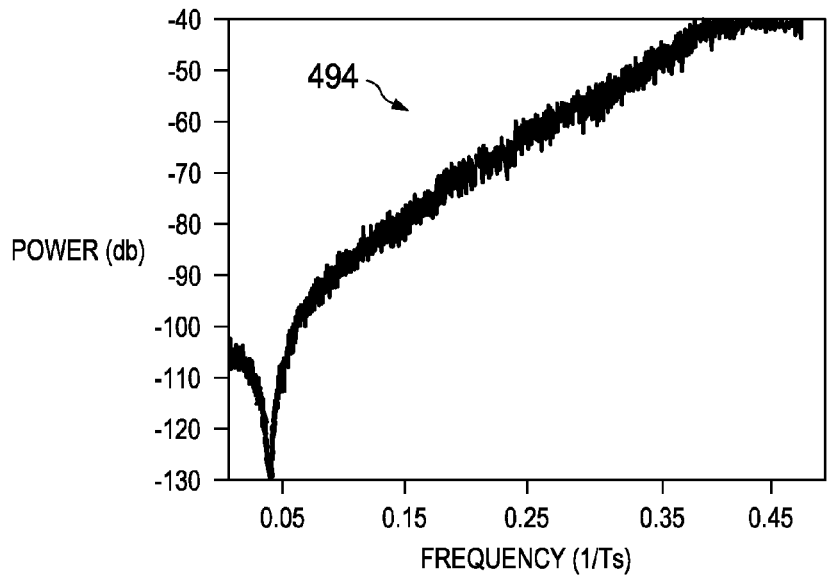
FIG. 20 is a graph depicting a frequency spectrum for an ideal analog-to-digital converter.

By way of further comparison, FIG. 20 depicts a simulated spectrum 494 for an analog-to-digital converter employing an ideal DAC element (e.g., $e_c=[0\ 0\ 0\ 0\ 0\ 0]$). The spectrum 494 is provided by the spectrally shaped quantization error and dither associated with the analog-to-digital converter element. Those skilled in the art will appreciate that the in-band noise in the calibrated system is nearly as low as for the ideal system. For example, the in-band noise power is only about 1.10 dB lower in the ideal DAC simulation than the example analog-to-digital converter implemented according to an aspect of the present invention. This indicates that the adaptation and correction works well and is close to the minimum achievable in-band noise power set by the noise-shaper characteristic.

Figure 21:
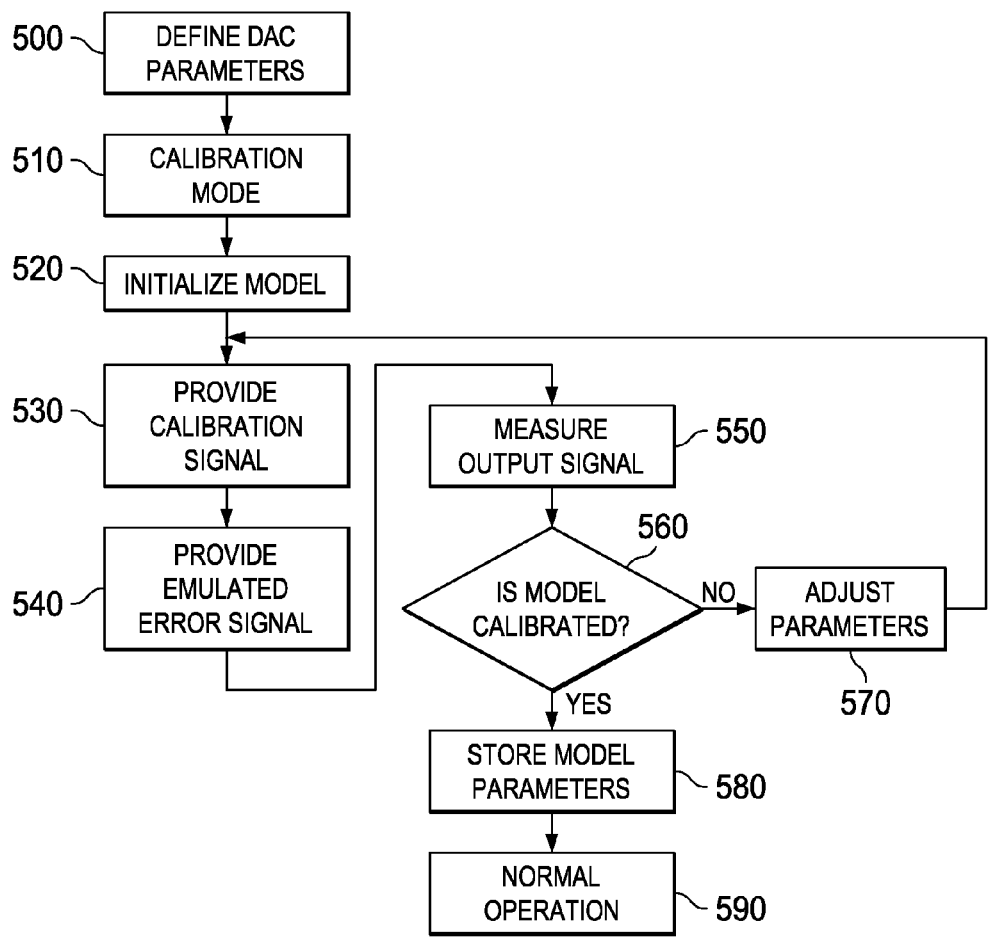
FIG. 21 is a flow diagram illustrating a methodology for calibrating a model in accordance with an aspect of the present invention.

In view of the foregoing structural and functional features described above, methodologies in accordance with an aspect of the present invention will be better appreciated with reference to FIG. 21. Those skilled in the art will understand and appreciate that not all illustrated features may be required to implement a methodology in accordance with an aspect of the present invention. While, for purposes of simplicity of explanation, the methodology of FIG. 21 is shown and described as being implemented serially, it is to be understood and appreciated that the present invention is not limited to the illustrated order, as some parts of the methodology could, in accordance with the present invention, occur in different orders or concurrently with other parts from that shown and described. It is further to be appreciated that the following methodology can be implemented as computer-executable instructions, such as software stored in a computer-readable medium. Alternatively, the methodology may be implemented as hardware (e.g., one or more ICs) or a combination of hardware and software, such as running in a DSP or ASIC.

FIG. 21 illustrates a methodology for calibrating a DAC error model in accordance with an aspect of the present invention. The methodology starts at 500 in which parameters for the error model are defined according to the converter topology. The defining of the model parameters can include identifying predetermined parameters according to the number of quantization levels for a DAC in an associated conversion system implementing the methodology. At 510, a calibration mode is entered, such as can occur in connection with powering up the conversion system implementing the methodology. Alternatively, the calibration mode can be entered in response to other criteria, such as an idle phase or an explicit instruction. As described herein, the calibration mode is utilized to adaptively program an error model to emulate error characteristics of at least a portion of the conversion system, such as including DAC error.

At 520, a model is initialized. The model initialization can include setting model parameters to respective starting values. Those skilled in the art will understand and appreciate various ways in which parameter values can be initially set, which can vary based on the particular algorithm being employed to calibrate the model. For example, starting parameter values for a given DAC topology can be set based on a theoretical estimate, experimental studies or they can be set randomly.

At 530, a calibration signal is provided. The calibration signal excites the conversion system, such as with a signal containing no energy at in-band frequencies. Alternatively, the calibration signal can correspond to an actual input signal provided to the conversion system for being converted into a desired form. Noise shaping (e.g., in the digital or analog domain) is performed on the input signal. Other processing also can be implemented on the noise shaped signal depending on the type of converter and converter topology.

At 540, an emulated error signal is provided. The emulated error signal is provided in response to an intermediate signal, for example, that is provided to an input of a DAC associated with the conversion system. In particular, the emulated error signal is provided as a function of the DAC input signal. For example, during the first iteration of the calibration mode, the emulated error signal will correspond to the initial model parameters provided at 520. The emulated error signal is fed to the conversion system in an effort to mitigate the error characteristics associated with the DAC. During a first portion of the calibration process, however, the model typically provides a poor approximation of the DAC errors, so that DAC error in the output signal of the converter may be high.

At 550, the converter output signal is measured. Those skilled in the art will understand and appreciate that the measurements of the output signal can be filtered to remove out-of-band components, including those associated with the calibration signal. Therefore, in circumstances where the calibration signal has no in-band content, the output signal defines a residual error signal substantially corresponding to only the DAC error being compensated.

At 560, a determination is made as to whether the model is sufficiently calibrated. For example, this determination can be made based on examining the residual error signal provided in the output signal of the conversion system. Alternatively or additionally, the calibration loop can be figured to run for a predetermined number of samples or for a predetermined time. Those skilled in the art will understand and appreciate various bases that can be employed for determining whether the model is adequately calibrated. If the determination at 560 is negative, indicating that the model is not yet calibrated, the methodology proceeds to 570. At 570, the model parameters are adaptively adjusted to further mitigate errors in the output of the converter system. The parameter adjustment at 570, for example, can be implemented based on the output signal of the converter or on an intermediate signal of the converter (e.g., based on inband frequency content of such signal). The parameter adjustment at 570 can be implemented by any adaptive algorithm, for example, the LMS algorithm. Those skilled in the art will appreciate that other adaptive or statistically-based algorithms can also be utilized to generate a model of the DAC errors in accordance with an aspect of the present invention. The loop defined by 530-570 can continue for a plurality of iterations to adaptively adjust the model parameters to convergence so as to minimize the error level at the output of the conversion system.

When the determination at 560 is affirmative, indicating that the model parameters have adequately converged to emulate the true error characteristics in the DAC, the methodology can proceed to 580. At 580, the model parameters are stored. For example, the model parameters can be stored in a look-up table of a suitable memory device. The look-up table thus is operative to provide an emulated error output signal as a function of the input signal to the DAC. From 580, the methodology proceeds to 590 in which normal operation of the system can begin. During normal operation, the programmed model is operative to provide the emulated error signal to mitigate error characteristics of the DAC in accordance with an aspect of the present invention.

What has been described above includes examples and implementations of the present invention. Because it is not possible to describe every conceivable combination of components, circuitry or methodologies for purposes of describing the present invention, one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A compensation system programmed to mitigate errors associated with a conversion system, the compensation system comprising:
 a digital error model programmed to provide an emulated error signal as a function of an input signal that is quantized in a predetermined number of one or more levels, the digital error model having parameters adaptively adjusted based on a signal of the conversion system to emulate error characteristics associated with at least a portion of the conversion system; and
 a calibration system that provides a calibration signal that is substantially free of in-band frequencies to the conversion system, the calibration system calibrates the parameters of the digital error model in a calibration mode by adapting the parameters of the digital error model during the calibration mode based on content of an output signal of the conversion system in response to the calibration signal that is provided to the conversion system, and wherein the calibration system includes an estimator having:
  a first delay element that receives the quantized signal;
  a bit splitter that receives an output from the delay first element;
  a matrix multiplier that receives an output from the bit splitter;
  a gain element that receives an output from the matrix multiplier;
  an adder that receives an output from the gain element; and
  a second delay element that receives an output from the adder and that provides its output to the adder.

2. The compensation system of claim 1, the calibration system further comprising the estimator operative to minimize error in the output signal by adjusting the parameters of the digital error model based on at least one of the input signal and the output signal of the conversion system.

3. The compensation system of claim 1, wherein the output signal of the conversion system corresponds to a residual error signal that minimizes as the digital error model better approximates error characteristics of the conversion system.

4. The compensation system of claim 3, further comprising a filter that filters the output signal of the conversion system to provide the residual error signal substantially free of out-of-band frequencies.

5. A conversion system comprising:
 a modulator that provides a quantized signal that is quantized in a predetermined number of one or more levels;
 a digital error model programmed to provide an emulated error signal to the modulator as a function of the quantized signal, the digital error model having parameters adaptively adjusted based on a signal of the conversion system to emulate error characteristics;
 a digital-to-analog converter (DAC) coupled to receive the quantized signal and to convert the quantized signal to a corresponding analog output signal, the error characteristics being error characteristics associated with the DAC; and
 a calibration system that generates a calibration signal in a calibration mode that substantially free of in-band frequencies and that calibrates the parameters of the digital error model during a calibration mode based on the analog output signal corresponding to the calibration signal, and the calibration system includes an estimator having:
  a first delay element that receives the quantized signal;
  a bit splitter that receives an output from the delay first element;
  a matrix multiplier that receives an output from the bit splitter;
  a gain element that receives an output from the matrix multiplier;
  an adder that receives an output from the gain element; and
  a second delay element that receives an output from the adder and that provides its output to the adder.

6. A compensation system programmed to mitigate errors associated with a conversion system, the compensation system comprising:
 a digital error model programmed to provide an emulated error signal as a function of an input signal that is quantized in a predetermined number of one or more levels, the digital error model having parameters adaptively adjusted based on a signal of the conversion system to emulate error characteristics associated with at least a portion of the conversion system;
 a digital-to-analog converter (DAC) coupled to receive the input signal that is quantized in the predetermined number of levels and to convert the input signal to a corresponding analog output signal, the error characteristics being error characteristics associated with the DAC;

an analog filter that substantially removes out-of-band frequencies and quantization noise from the corresponding analog output signal, and provides a filtered analog signal;

an analog-to-digital converter that receives and converts the filtered analog signal into a corresponding digital representation of the filtered signal; and a calibration system that calibrates the parameters of the digital error model as a function of the digital representation of a filtered calibration signal so as to mitigate errors in the digital representation of the filtered calibration signal, wherein a calibration signal that corresponds to the filtered calibration signal is substantially free of in-band frequencies, and the calibration system includes an estimator having:

a first delay element;

a bit splitter that receives an output from the delay first element;

a matrix multiplier that receives an output from the bit splitter;

a gain element that receives an output from the matrix multiplier;

an adder that receives an output from the gain element; and a second delay element that receives an output from the adder and that provides its output to the adder.

7. A compensation system programmed to mitigate errors associated with a conversion system, in combination with an analog-to-digital converter (ADC) system that forms part of the conversion system, the compensation system combination comprising:

a digital error model programmed to provide an emulated error signal as a function of an input signal that is quantized in a predetermined number of one or more levels, the digital error model being parameterized by an error coefficient vector that includes a plurality of error coefficients, at least a portion of the plurality of error coefficients being adaptively adjusted based on a calibration signal from the conversion system that is substantially free of in-band frequencies to emulate error characteristics associated with at least a portion of the conversion system; and the ADC system comprising:

a noise-shaping filter that receives an analog input signal and provides a filtered representation of the analog input signal;

an ADC that converts the filtered representation of the analog input signal to a corresponding digital output signal, the digital output signal defines the input signal having the predetermined number of levels; and a digital-to-analog converter (DAC) that converts the digital output signal of the ADC to a corresponding analog representation thereof that is provided to the noise shaping filter; and the at least a portion of the plurality of error coefficients of the model being calibrated using a calibration system to provide the emulated error signal as a function of the corresponding digital output signal of the ADC to mitigate errors in the digital output signal, the error characteristics being error characteristics associated with the DAC, wherein calibration system that calibrates the parameters of the digital error model as a function of the filtered digital signal by adaptively adjusting the parameters of the model to mitigate errors in the filtered digital signal and wherein the calibration system includes an estimator having:

a first delay element;

a bit splitter that receives an output from the delay first element;

a matrix multiplier that receives an output from the bit splitter;

a gain element that receives an output from the matrix multiplier;

an adder that receives an output from the gain element; and a second delay element that receives an output from the adder and that provides its output to the adder.

8. The combination of claim 7, further comprising:

a digital filter that substantially removes out-of-band frequencies in the corresponding digital output signal of the ADC, and the digital filter provides a filtered digital signal.

9. A conversion system comprising:

a noise shaping filter that provides a noise-shaped signal for conversion to a corresponding output signal of the conversion system;

a model operative to introduce a compensation error signal into the conversion system based on a digital representation of the noise-shaped signal having plural quantization levels; and a calibration system that adaptively programs parameters of the model during a calibration mode in which a calibration signal that is substantially free of in-band frequencies is provided to the conversion system, the calibration system adapting the parameters of model in the calibration mode to emulate error characteristics associated with at least a portion of the conversion system by adjusting parameters of the model to mitigate residual error in the output signal of the conversion system, wherein the calibration system includes an estimator having:

a first delay element;

a bit splitter that receives an output from the delay first element;

a matrix multiplier that receives an output from the bit splitter;

a gain element that receives an output from the matrix multiplier;

an adder that receives an output from the gain element; and a second delay element that receives an output from the adder and that provides its output to the adder.

10. The system of claim 9, wherein the estimator is operative to minimize error in the output signal by adjusting the parameters of the model based on at least one of the digital representation of the noise-shaped signal and the output signal of the conversion system.

11. The system of claim 9, wherein the calibration signal being provided substantially free of in-band frequencies, such that the output signal of the conversion system corresponds to a residual error signal that minimizes as the model better approximates the error characteristics during the calibration mode.

12. The system of claim 11, further comprising a filter that filters the output signal of the conversion system to provide the residual error signal substantially free of out-of-band frequencies.

13. The conversion system of claim 9 defining an analog-to-digital converter (ADC) system, the ADC system further comprising:

an ADC that converts the noise-shaped signal to a corresponding digital output signal, the digital output signal defines the digital representation of the noise-shaped signal;

a digital-to-analog converter (DAC) that converts the digital output signal of the ADC to a corresponding analog representation thereof that is provided to the noise shaping filter; and the model being calibrated to provide the emulated error signal as a function of the digital output signal of the ADC to mitigate errors in the digital output signal, the error characteristics being error characteristics associated with the DAC.

14. The conversion system of claim 9 defining a digital-to-analog converter (DAC) system, the DAC system further comprising:

a quantizer that provides a quantized signal based on the noise-shaped signal, the quantized signal defining the digital representation of the noise-shaped signal;

a DAC that converts the quantized signal to a corresponding analog signal that defines the output signal of the conversion system, the error characteristics being error characteristics associated with the DAC; and the error model providing the emulated error signal to the noise shaping filter as a function of the quantized signal.

* * * * *

UNITED STATES PATENT AND TRADEMARK OFFICE
CERTIFICATE OF CORRECTION

| | | |
|---|---|---|
| PATENT NO. | : 7,894,536 B2 | Page 1 of 1 |
| APPLICATION NO. | : 10/724817 | |
| DATED | : February 22, 2011 | |
| INVENTOR(S) | : Lars Risbo and Thomas H. Hansen | |

It is certified that error appears in the above-identified patent and that said Letters Patent is hereby corrected as shown below:

Title Page, Item (54), and Col. 1, Line 1, should read:

"CALIBRATED MODEL TO MITIGATE DATA CONVERSION ERRORS"

Signed and Sealed this
Tenth Day of May, 2011

David J. Kappos
*Director of the United States Patent and Trademark Office*